United States Patent
Miyazaki

(10) Patent No.: US 7,861,913 B2
(45) Date of Patent: Jan. 4, 2011

(54) SOLDERING METHOD FOR MOUNTING SEMICONDUCTOR DEVICE ON WIRING BOARD TO ENSURE INVARIABLE GAP THEREBETWEEN, AND SOLDERING APPARATUS THEREFOR

(75) Inventor: Shinichi Miyazaki, Kanagawa (JP)

(73) Assignee: NEC Electronics Corporation, Kawasaki, Kanagawa (JP)

(*) Notice: Subject to any disclaimer, the term of this patent is extended or adjusted under 35 U.S.C. 154(b) by 18 days.

(21) Appl. No.: 12/232,577

(22) Filed: Sep. 19, 2008

(65) Prior Publication Data

US 2009/0029488 A1 Jan. 29, 2009

Related U.S. Application Data

(62) Division of application No. 11/545,467, filed on Oct. 11, 2006.

(30) Foreign Application Priority Data

Oct. 12, 2005 (JP) .............................. 2005-297586

(51) Int. Cl.
*B23K 1/06* (2006.01)
*B23K 31/02* (2006.01)

(52) U.S. Cl. ..................... 228/228; 228/127; 228/233.1; 228/234.1; 228/235.1; 228/102; 228/103; 156/311; 156/580; 156/583.1; 156/583.2; 29/738; 29/739; 29/740; 438/5; 438/106

(58) Field of Classification Search ............... 228/127, 228/228, 233.1, 234.1, 235.1, 102, 103; 156/311, 156/580, 583.1, 583.2; 29/738, 739, 740; 438/5, 106
See application file for complete search history.

(56) References Cited

U.S. PATENT DOCUMENTS 6,131,795 A 10/2000 Sato

FOREIGN PATENT DOCUMENTS

JP 2003-31993 1/2003

OTHER PUBLICATIONS

Chinese Office Action dated May 16, 2008, with an English translation.

*Primary Examiner*—Jessica L Ward
*Assistant Examiner*—Erin B Saad
(74) *Attorney, Agent, or Firm*—McGinn IP Law Group, PLLC

(57) ABSTRACT

In a soldering method for mounting a semiconductor device on a wiring board, a plurality of solid-phase solders are provided between the semiconductor device and the wiring board, and are thermally melted to thereby produce a plurality of liquid-phase solders therebetween. A constant force is exerted on the liquid-phase solders by relatively moving the semiconductor device with respect to the wiring board so that an invariable gap is determined between the semiconductor device and the wiring board.

18 Claims, 14 Drawing Sheets

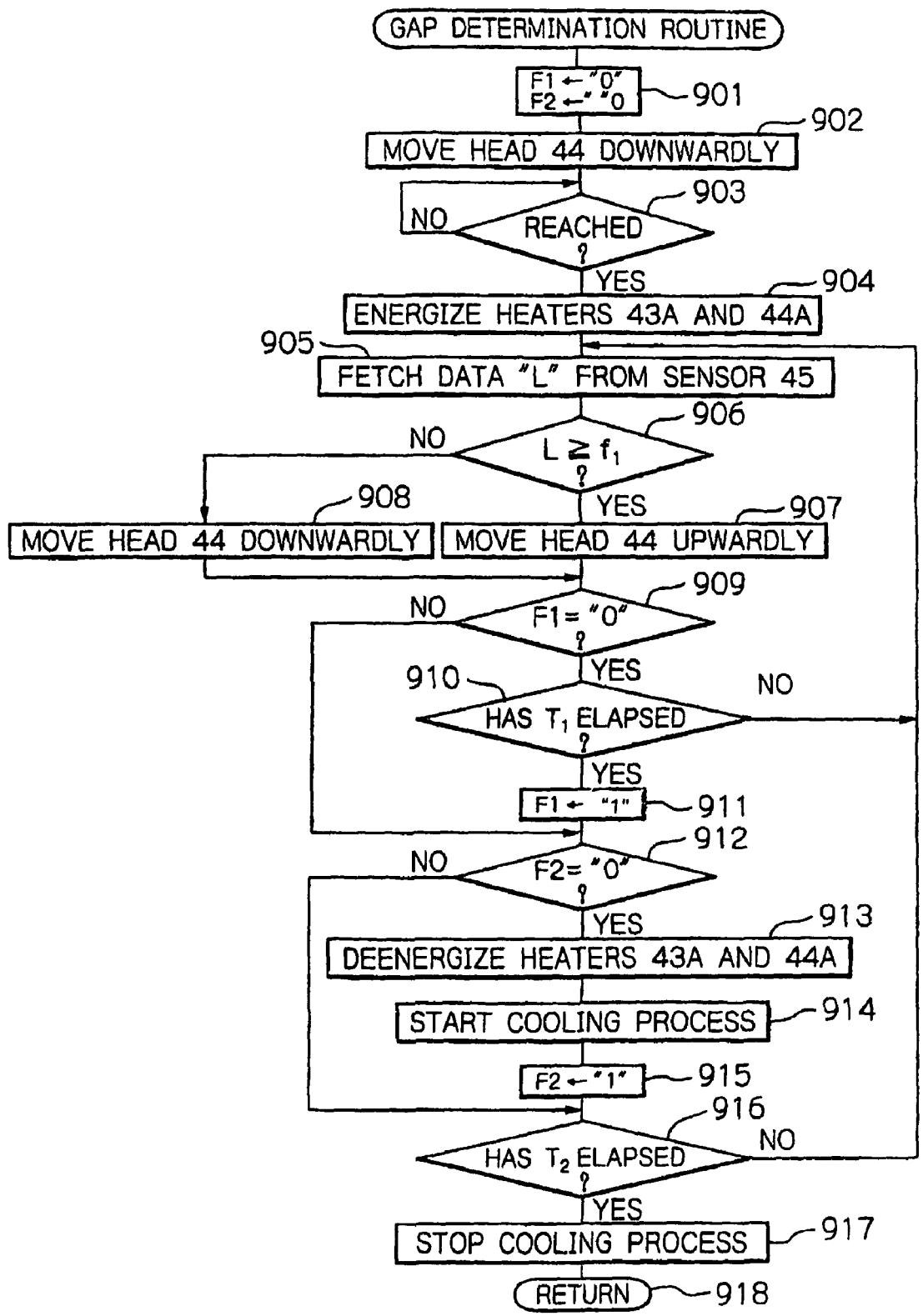

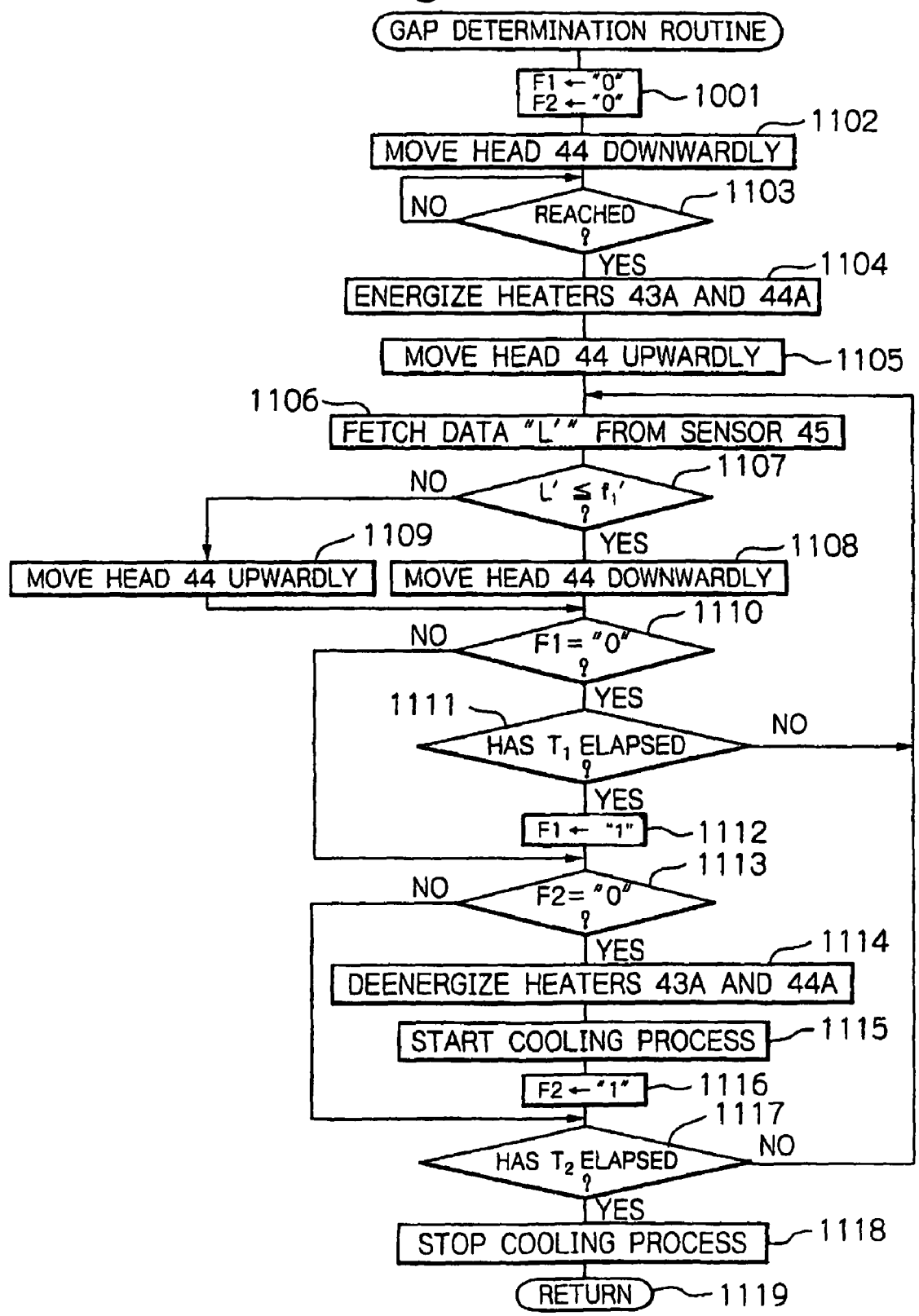

SOLDERING METHOD FOR MOUNTING SEMICONDUCTOR DEVICE ON WIRING BOARD TO ENSURE INVARIABLE GAP THEREBETWEEN, AND SOLDERING APPARATUS THEREFOR

The present Application is a Divisional Application of U.S. patent application Ser. No. 11/545,467, filed on Oct. 11, 2006.

BACKGROUND OF THE INVENTION

1. Field of the Invention

The present invention relates to a soldering method for mounting a semiconductor device on a wiring board, and relates to a soldering apparatus for carrying out such a soldering method.

2. Description of the Related Art

For example, when a flip-chip type semiconductor chip, featuring a plurality of solder bumps as outer electrode terminals, is mounted on an interposer or wiring board, an invariable gap must always be established between the semiconductor chip and the wiring board.

Conventionally, in order to ensure the establishment of the invariable gap between the semiconductor chip and the wiring board, a prior art soldering method utilizes an arrangement of the solder bumps, as disclosed in, for example, JP-2003-031993A. Namely, the semiconductor chip is downwardly moved to the wiring board so that the solder bumps are abutted against on the wring board. When the solder bumps are abutted on the wiring board, a position of the semiconductor chip concerned is defined as a reference position. Then, while the solder bumps are soldered to the wiring board, the semiconductor chip is positionally adjusted with respect to the reference position so that any negative influences, exerted on the establishment of the invariable gap the semiconductor chip and the wiring board, can be eliminated, as stated in detail hereinafter.

SUMMARY OF THE INVENTION

It has now been discovered that the above-mentioned prior art soldering method has a problem to be solved as mentioned hereinbelow.

The solder bumps may fluctuate in size or diameter. When the fluctuation of the solder bumps is large, the prior art soldering method fails to properly define the reference position, as discussed in detail hereinafter.

In accordance with a first aspect of the present invention, there is provided a soldering method for mounting a semiconductor device on a wiring board. In the soldering method, a plurality of solid-phase solders provided between the semiconductor device and the wiring board are thermally molten to thereby produce a plurality of liquid-phase solders therebetween, and then a constant force is exerted on the liquid-phase solders by moving the semiconductor device with respect to the wiring board, so that an invariable gap is determined between the semiconductor device and the wiring board.

The semiconductor device may be moved toward the wiring board so that the liquid-phase solders are pressed therebetween. In this case, a pressing force exerted on the liquid-phase solders is detected during the relative movement of the semiconductor device with respect to the wiring board, and the relative movement of the semiconductor device is controlled so that the pressing force is obtained as a constant force, resulting in the determination of the invariable gap between the semiconductor device and the wiring board. The relative movement of the semiconductor device toward the wiring board may be carried out during a rise in temperature of the solid-phase solders.

On the other hand, the semiconductor device may be moved away from the wiring board so that the liquid-phase solders are stretched therebetween. In this case, a pulling force exerted on the liquid-phase solders is detected during the relative movement of the semiconductor device with respect to the wring board, and the relative movement of the semiconductor device is controlled so that the pulling force is obtained as the constant force, resulting in the determination of the invariable gap between the semiconductor device and the wiring board. The relative movement of the semiconductor device away from the wiring board may be carried out during a fall in temperature of the solid-phase solders.

Preferably, the semiconductor device is held by a driver unit having a load sensor, and is moved with respect to the wiring board by driving the driver unit having the load sensor. In this case, a force exerted as a reaction force on the driver unit by the liquid-phase solders may be detected by the load sensor so that the force is obtained as the constant force, resulting in the determination of the invariable gap between the semiconductor device and the wiring board. Also, the force may be detected as a pressing force exerted on the liquid-phase solders. Optionally, the force may be detected as a pulling force exerted on the liquid-phase solders.

In accordance with a second aspect of the present invention, there is a soldering apparatus for mounting a semiconductor device on a wiring board. The soldering apparatus includes a stage on which the wiring board is placed, and a driver unit that holds the semiconductor device. The semiconductor device is moved with respect to the wiring board by the driver unit so that a constant force is exerted on a plurality of liquid-phase solders provided between the semiconductor device and the wiring board, whereby an invariable gap is determined between the semiconductor device and the wiring board.

The soldering apparatus may further comprise a load sensor that detects a force which is exerted as a reaction force on the semiconductor device by the liquid-phase solders, and a control unit that controls the driver unit so that the force is obtained as the constant force. In this case, the force may detected as a pressing force obtained by moving the semiconductor device toward the wiring board. Optionally, the force is detected as a pulling force obtained by moving the semiconductor device away from the wiring board.

In the soldering apparatus, the load sensor may be contained in the driver unit so that the force is detected as one exerted on the driver unit by the semiconductor device. The force may be detected as a pressing force exerted on the liquid-phase solders. Optionally, the force may be detected as a pulling force exerted on the liquid-phase solders. Preferably, the load sensor features a resolution ability of at most 0.02 N.

In accordance with a third aspect of the present invention, there is provided a soldering method for mounting a semiconductor device on a wiring board. In this third aspect, a semiconductor device having a plurality of external metal terminals is held by a driver unit, and the semiconductor device is placed on a wiring board by the driver unit so that the external metal terminals are provided therebetween. Then, the external metal terminals are thermally heated to thereby produce melted metal terminals, and the semiconductor device is relatively moved with respect to the wiring board by the driver unit. Then, a force exerted as a reaction force on the driver unit by the melted metal terminals between the semiconductor device and the wiring board is detected during the relative movement of the semiconductor device with respect to the wiring board, and the driver unit is controlled so that the force is obtained as a predetermined constant force, resulting in determination of an invariable gap between the semiconductor device and the wiring board.

In accordance with a fourth aspect of the present invention, there is provided a soldering apparatus for mounting a semiconductor device on a wiring board. In the fourth aspect, the soldering apparatus includes a stage on which the wiring board is placed, a driver unit that holds the semiconductor device having a plurality of external metal terminals, so that the semiconductor device is relatively moved with respect to the wiring board, and a heater unit that thermally melts the external metal terminals. Also, the soldering apparatus includes a load sensor that detects a force exerted as a reaction force on the semiconductor device by the melted external metal terminals between the semiconductor device and the wiring board during the relative movement of the semiconductor device with respect to the wiring board, and a control unit that controls the driver unit so that the force is obtained as a predetermined constant force, resulting in determination of an invariable gap between the semiconductor device and the wiring board.

BRIEF DESCRIPTION OF THE DRAWINGS

The present invention will be more clearly understood from the description set forth below, as compared with the prior art method, with reference to the accompanying drawings, wherein:

FIG. 9 is a flowchart of a first example of a gap determination routine executed in step 804 of FIG. 8;

FIG. 11 is a flowchart of a second example of the gap determination routine executed in step 804 of FIG. 8.

DESCRIPTION OF THE PREFERRED EMBODIMENT

Before a description of an embodiment of the present invention, for better understanding of the present invention, a prior art soldering method for mounting a semiconductor chip on a wiring board will be explained with reference to FIGS. 1A through 1F. Note, the prior art soldering method is disclosed in, for example, JP-2003-031993 A, and is carried out by using a soldering apparatus.

Figure 1A:
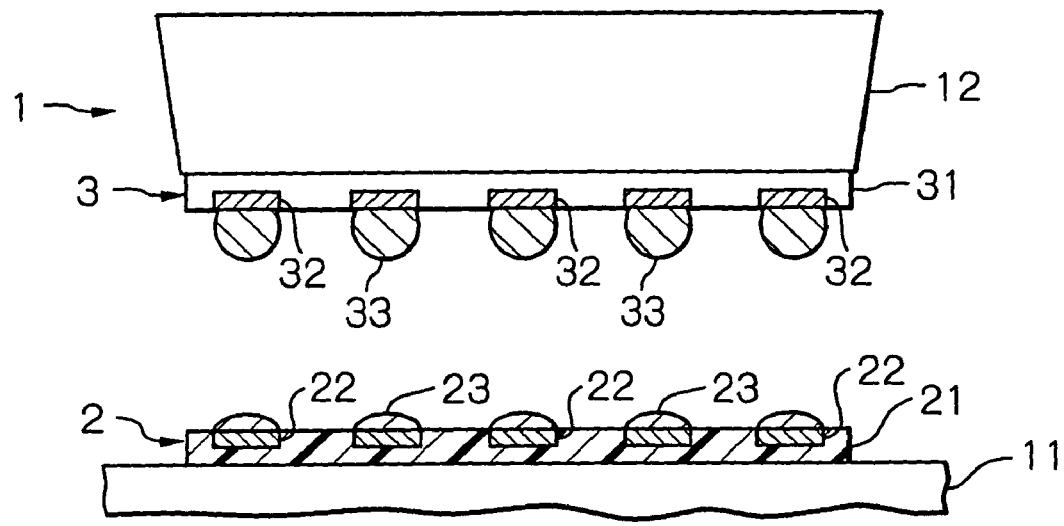
FIGS. 1A through 1D are partial cross-sectional views for explaining a prior art soldering method for mounting a semiconductor chip on a wiring board.

First, referring to FIG. 1A which is a schematic partial cross-sectional view, a soldering apparatus, which is partially illustrated, is indicated by reference numeral 1. The soldering apparatus 1 includes an X-Y stage 11, and a tool head or chip-holder head 12 provided above the X-Y stage 11. Also, the soldering apparatus 1 includes a control unit (not shown) containing a microcomputer to control operations of the X-Y stage 11, and the chip-holder head 12 and so on.

A wiring board, generally indicated by reference numeral 2, is prepared, and is set in place on the X-Y stage 11. The X-Y stage 11 is operated under control of the control unit (not shown) so that the wiring board 2 is moved in an X direction and a Y direction perpendicular to each other.

A wiring board 2 includes an insulating substrate 21 composed of a plurality of insulating layers in each of which an interconnection pattern structure (not shown) is formed, a plurality of electrode pads 22 formed in the uppermost insulating layer of the insulating substrate 21, and a plurality of provisional solders 23 with which the respective electrode pads 22 are coated.

For example, for the solder, it is possible to use a suitable alloy composed of tin (Sn), silver (Ag) and copper (Cu), and each of the electrode pads 22 is composed of copper (Cu), gold (Au) or the like, exhibiting a wettability by a thermally melted solder. Also, the uppermost insulating layer of the insulating substrate 21 is defined as a solder resist layer, exhibiting a non-wettability by a thermally melted solder, which may be composed of polyimide resin, epoxy resin or the like.

Also, as shown in FIG. 1A, a semiconductor chip, generally indicated by reference numeral 3, is prepared, and is held by the chip-holder head 12, which may be constructed as a vacuum sucker to suck and hold the semiconductor chip 3. The chip-holder head 12 is operated under control of the control unit so as to be vertically moved with respect to the X-Y stage 11.

The semiconductor chip 3 is formed as a flip-chip type semiconductor chip, and includes a semiconductor substrate 31, a plurality of electrode pads 32 formed on a top surface of the semiconductor substrate 31, and a plurality of solder bumps 33 adhered to the respective electrode pads 32.

Note, there is a mirror image relationship between an arrangement of the solder bumps 33 and an arrangement of the provisional solders 23.

Each of the solder bumps 33 may be composed of the same alloy as the provisional solders 34 of the wiring board 2, and each of the electrode pads 32 may be composed of copper (Cu), gold (Au) or the like, exhibiting a wettability by a thermally melted solder. Also, although not illustrated, an uppermost insulating layer of the semiconductor chip 3, in which the electrode pads 33 are formed, is defined as a solder resist layer, exhibiting a non-wettability by a thermally melted solder, which may be composed of polyimide resin, epoxy resin or the like.

As shown in FIG. 1A, the wiring board 2 is positioned with respect to the semiconductor chip 3 by driving the X-Y stage 11 so that the respective solder bumps 32 are vertically aligned with the provisional solders 23.

Figure 1B:
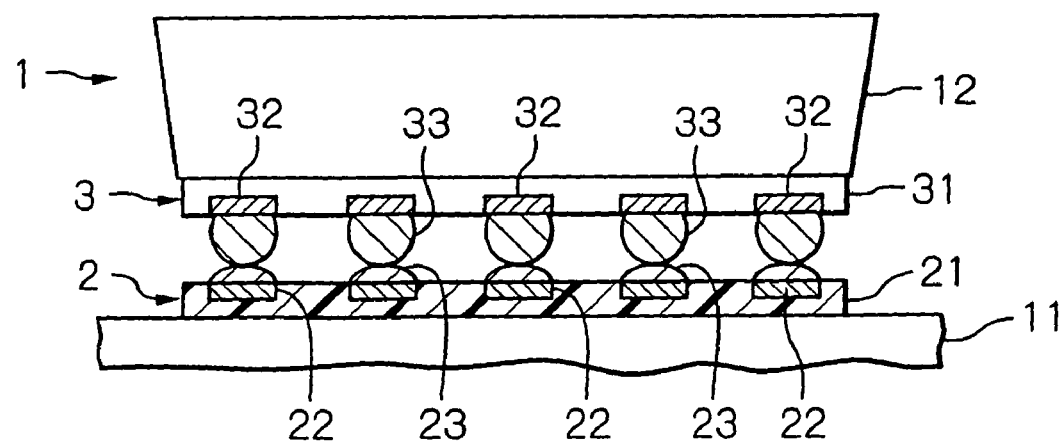

Next, referring to FIG. 1B which is a schematic partial cross-sectional view, the chip-holder head 12 is downwardly moved until the respective solder bumps 33 are abutted against the provisional solders 23.

Figure 1C:
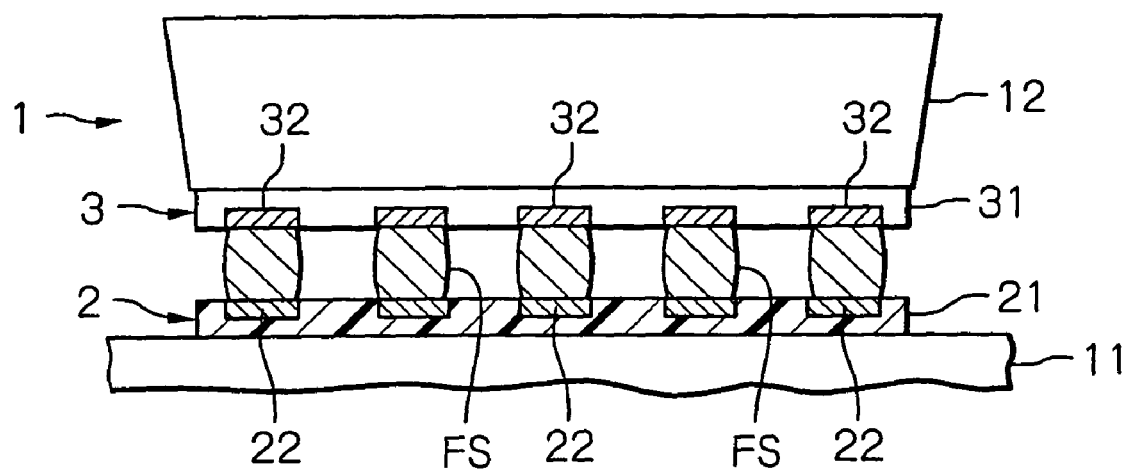

Next, referring to FIG. 1C which is a schematic partial cross-sectional view, the provisional solders 23 and the solder bumps 33 are thermally melted and fused with each other so that a plurality of fused solders FS are respectively produced between the electrode pads 22 and the electrode pads 32. Then, the fused solders FS are cooled so as to be set, thereby resulting in completion of the mounting of the semiconductor chip 3 on the wiring board 2.

Note that the X-Y stage 11 and the chip-holder head 12 may contain respective electric heaters to thermally melt the provisional solders 23 and the solder bumps 33 for the production of the fused solders FS. Also, note that the soldering apparatus may be provided with a cooling system for blowing cool air over the fused solders FS to thereby set them.

Figure 1D:
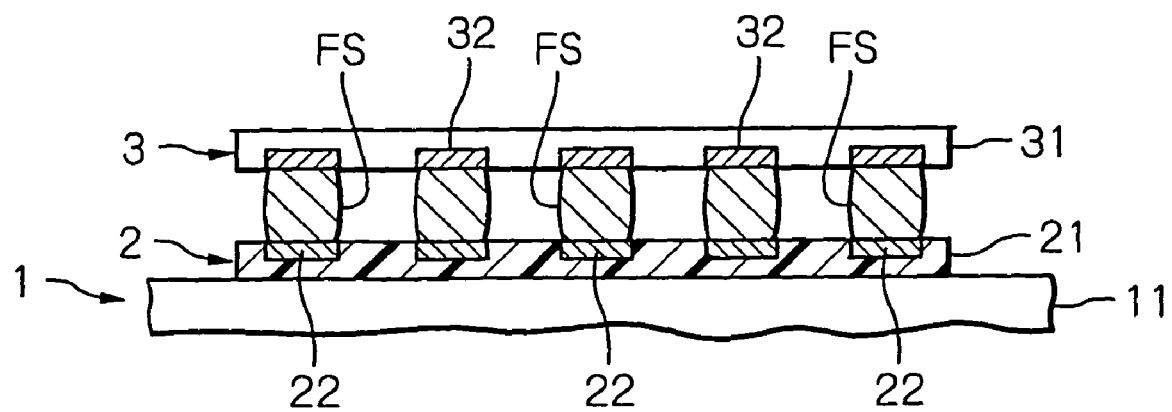

Next, referring to FIG. 1D which is a schematic partial cross-sectional view, after the setting of the fused solders FS, the semiconductor chip 3 is unloaded from the chip-holder head 12, and the semiconductor chip 3 with the wiring board 2 is unloaded from the X-Y stage 11.

In the above-mentioned soldering method, although a gap between the wiring board 2 and the semiconductor chip 3 should be always invariable, the gap may fluctuate due to dimensional variations of the X-Y stage 11, the chip-holder head 12 and so on, which are caused by thermal expansion and thermal shrinkage thereof.

JP-2003-031993 A discloses a technique for eliminating the fluctuation of the gap between the wiring board 2 and the semiconductor chip 3. In particular, the dimensional variation of the chip-holder head 12 is previously measured with respect to a change of a temperature of the chip-holder head 12. During the soldering of the semiconductor chip 3 to the wiring board 3, the temperature of the chip-holder head 12 is detected, and a movement of the chip-holder head 12 is controlled by the control unit to thereby compensate for the dimensional variation of the chip-holder head 12, so that the gap between the wiring board 2 and the semiconductor chip 3 can be maintained constant.

Also, JP-2003-031993 A discloses another technique for ensuring the establishment of an invariable gap between the wiring board 2 and the semiconductor chip 3. In particular, when the chip-holder head 12 is downwardly moved until the solder bumps 33 are abutted against the respective provisional solders 23, and the position of the chip-holder head 12 is detected and defined as a reference position. Then, during the soldering of the semiconductor chip 2 to the wiring board 3, a movement of the chip-holder head 12 is controlled so that the chip-holder head 12 stays at the reference position.

In either event, the controlling of the movement of the chip-holder head 12 is based on the reference position, which is renewed whenever a semiconductor chip 3 is mounted on a wiring board 2.

Figure 2A:
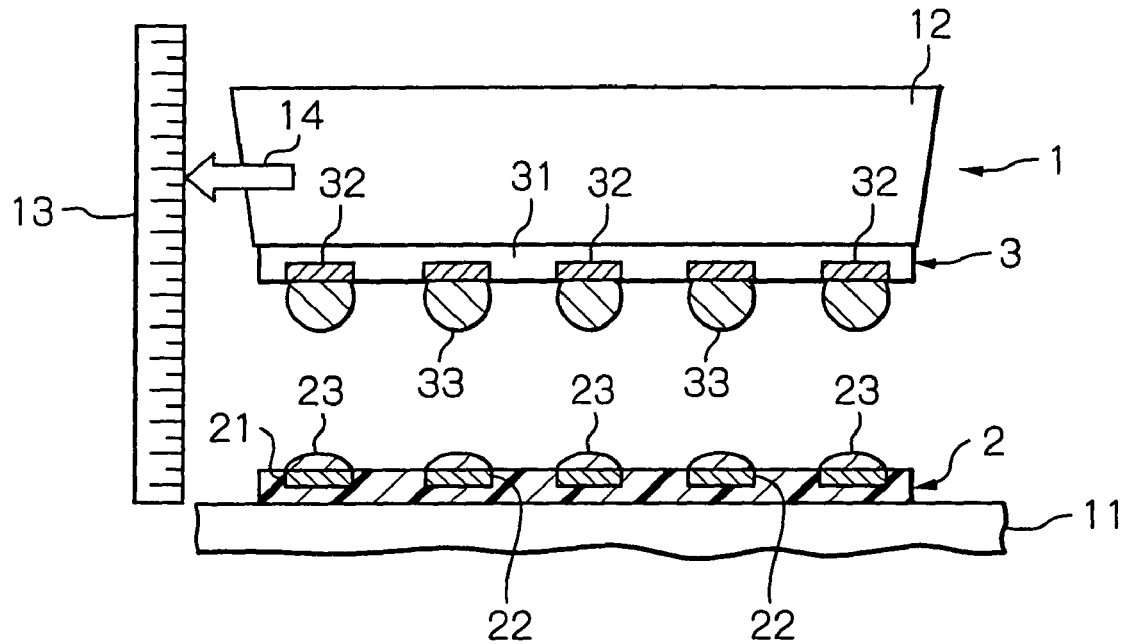
FIGS. 2A and 2B are partial cross-sectional views, corresponding to FIGS. 1A and 1B, for explaining how to define a reference position of a semiconductor chip with respect to a wiring board.
Figure 2B:
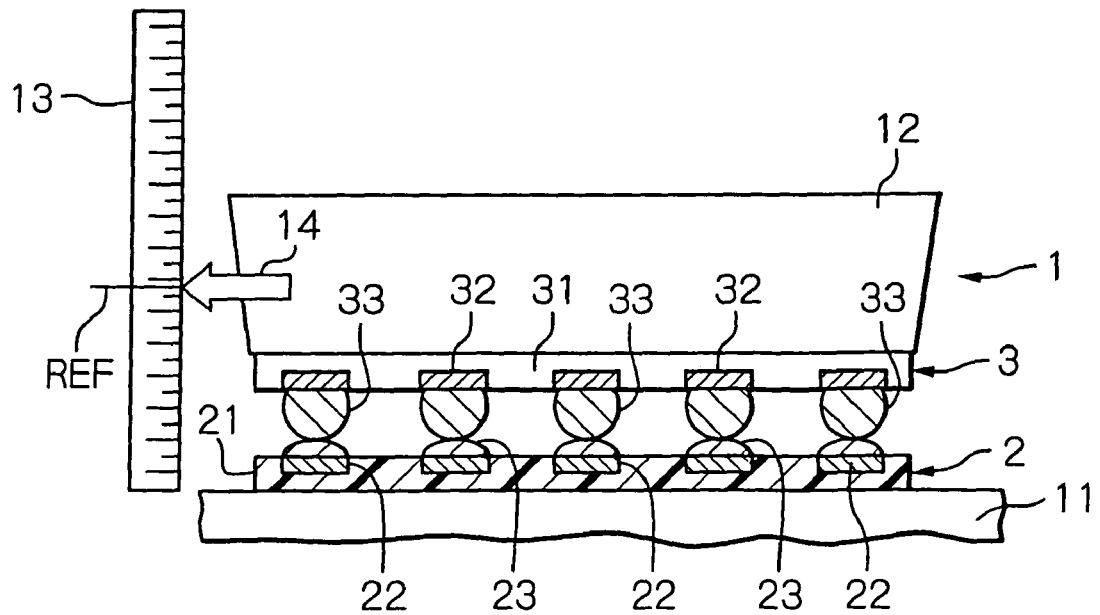

FIGS. 2A and 2B conceptually show how the reference position of the chip-holder head 12 is defined with respect to the wiring board 2.

As shown in FIGS. 2A and 2B which correspond to FIGS. 1A and 1B, respectively, the soldering apparatus 1 further includes a linear scale 13 vertically provided along a path for the movement of the chip-holder head 12, and a scale sensor 14 supported by the chip-holder head 12 to detect and read a division of the linear scale 13. Note, in FIGS. 2A and 2B, the scale sensor 14 is conceptually and symbolically represented by an open arrow.

The chip-holder head 12 is downwardly moved from an upper position of FIG. 2A toward the wiring board 2, and the downward movement of the chip-holder head 12 is continued until the solder bumps 33 of the semiconductor chip 3 are abutted against the provisional solders 22 of the wiring board 2, as shown in FIG. 2B. Namely, when the solder bumps 33 are abutted against the provisional solders 22, the downward movement of the chip-holder head 12 is stopped, and a division REF of the linear scale 13 is detected and read by the scale sensor 14. The division REF (see: FIG. 2B) is recognized by the aforesaid control unit as a reference position of the chip-holder head 12.

Then, as soon as the provisional solders 23 and the solder bumps 33 are thermally melted, a movement of the chip-holder head 12 is controlled so that the chip-holder head 12 stays at the reference position until the soldering of the semiconductor chip 3 to the wiring board 2 is completed, whereby an invariable gap can be always obtained between the wiring board 2 and the semiconductor chip 3.

The above-mentioned prior art soldering method is useful provided that all the solder bumps 33 have no production fluctuation in size, i.e., that all the solder bumps 33 have the same size as each other. However, for example, when even only one of the solder bumps 33 has a larger size than that of the remaining solder bumps 33, the prior art soldering method fails in obtaining the invariable gap between the wiring board 2 and the semiconductor chip 3.

Figure 3A:
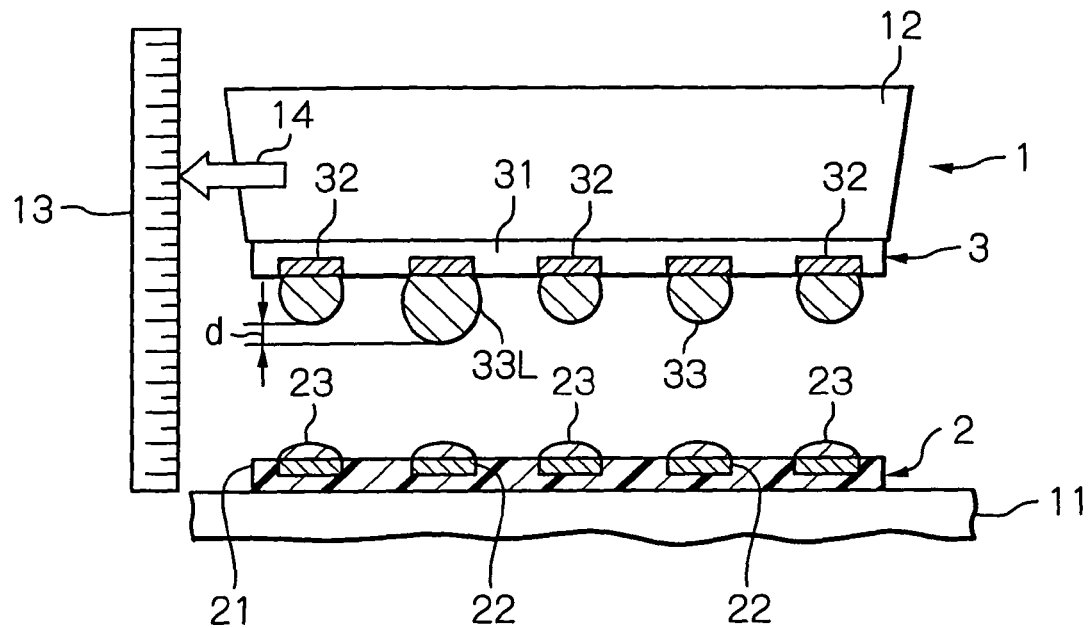
FIGS. 3A and 3B are partial cross-sectional views, corresponding to FIGS. 2A and 2B, for explaining why a predetermined gap between the semiconductor chip and the wiring board cannot be obtained.
Figure 3B:
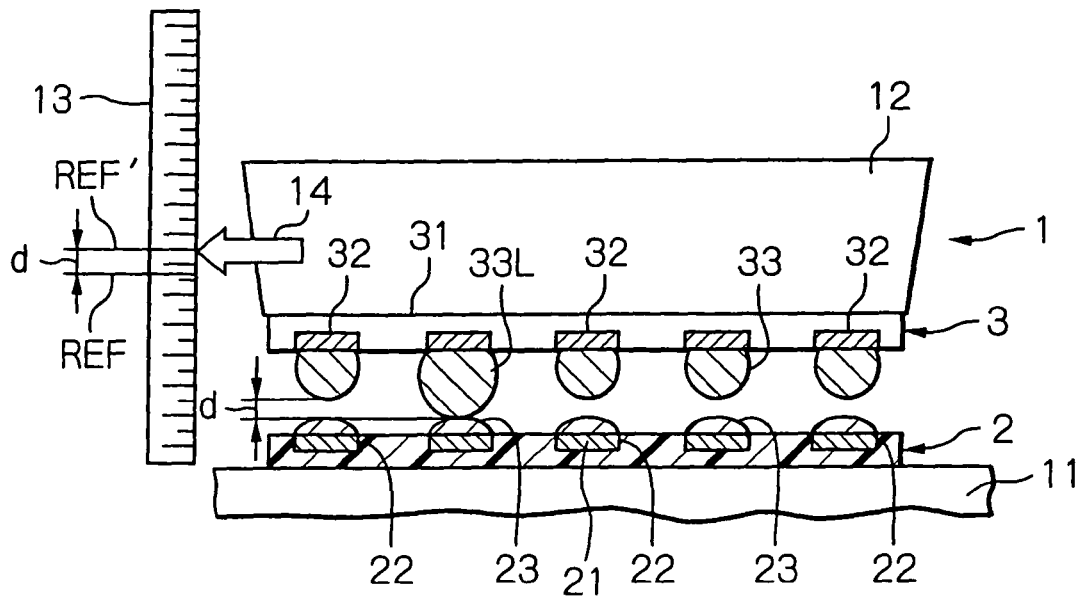

FIGS. 3A and 3B show why it is impossible to obtain the invariable gap between the wiring board 2 and the semiconductor chip 3 when even only one of the solder bumps 33 has a larger size than that of the remaining solder bumps 33.

In FIGS. 3A and 3B which correspond to FIGS. 2A and 2B, respectively, one of the solder bumps 33 shown in FIGS. 2A and 2B is replaced with a large-sized solder bump indicated by reference 33L. While the chip-holder head 12 is downwardly moved from the upper position of FIG. 3A toward the wiring board 2, the large-sized solder bump 33L is prematurely abutted against the corresponding provisional solder 23, as shown in FIG. 3B. At this time, the downward movement of the chip-holder head 12 is stopped, and a division REF' of the linear scale 13 is detected and read by the scale sensor 14.

As shown in FIG. 3B, the division REF' is shifted from the division REF by a difference between a height of the solder bump 33 and a height of the large-size solder bump 33L so that the aforesaid control unit mistakes the division REF for the division REF'. Namely, the division REF' is mistakenly recognized by the aforesaid control unit as the reference position of the chip-holder head 12. Thus, it is impossible to obtain the predetermined gap between the wiring board 2 and the semiconductor chip 3 when even only one of the solder bumps 33 has a larger size than that of the remaining solder bumps 33.

Incidentally, various methods are well known to produce solder bumps. In a so-called printing method, it is possible to produce a plurality of solder bumps at minimum low cost, but fluctuation in a size of the produced solder bumps is large. For example, when the solder bumps having an aimed size or diameter of 100 μm are produced by the printing method, the fluctuation in the aimed size or diameter is ±20 μm. Thus, in the above-mentioned prior art soldering method, it is impossible to use the solder bumps produced by the printing method, for the reasons already stated above.

Figure 4:
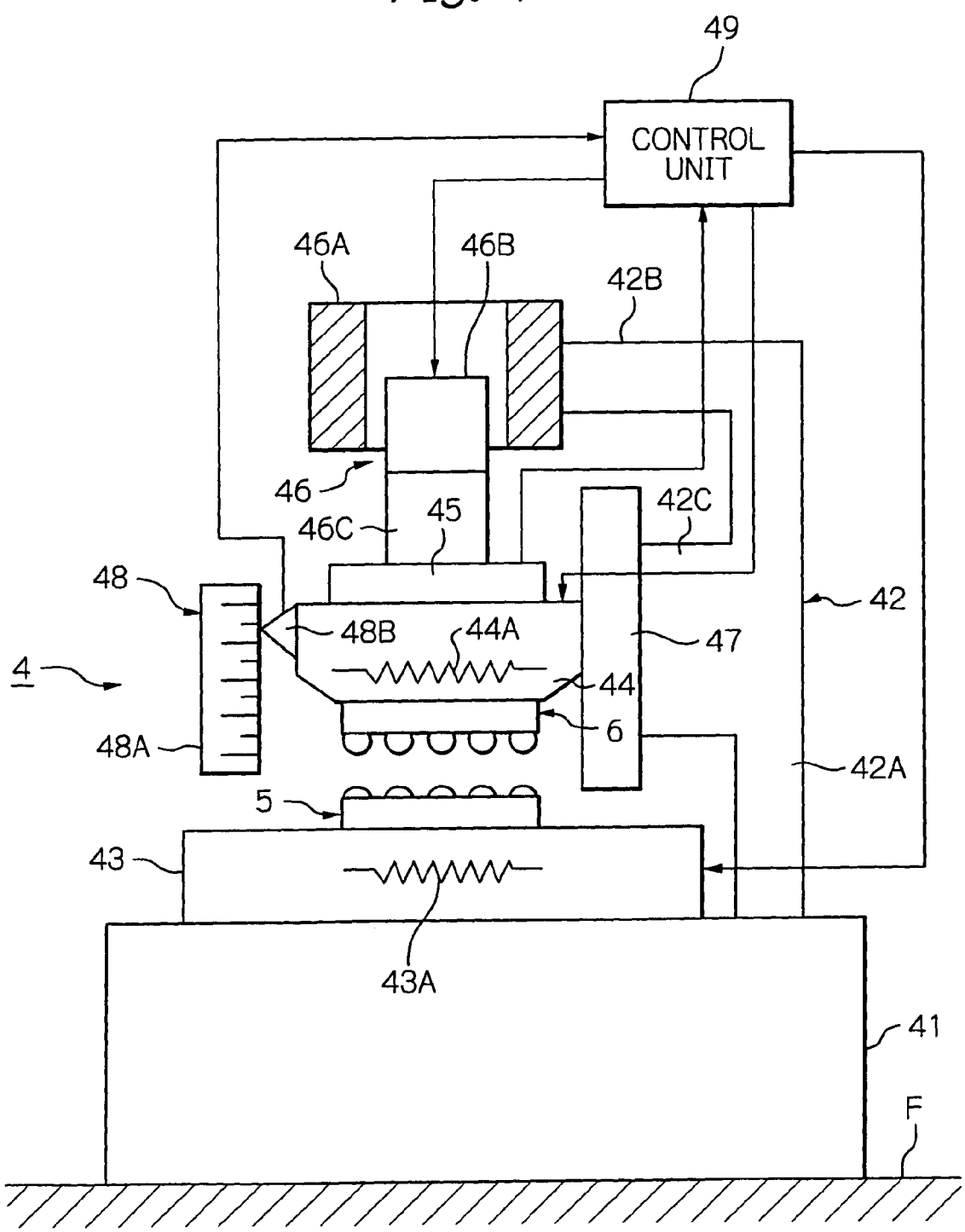
FIG. 4 is a schematic view of an embodiment of a soldering apparatus according to the present invention.

With reference to FIG. 4, an embodiment of a soldering apparatus according to the present invention is explained below.

A soldering apparatus, generally indicated by reference 4, includes a base frame 41 fixed on a floor F, and an upright structure 42 securely mounted on the base frame 41. The upright structure 42 includes a column member 42A implanted in the base frame 41, an arm member 42B horizontally extended from a top end portion of the column member 42A, and a plate-like member 42C extended from a middle portion of the column member 42A.

The soldering apparatus 4 also includes an X-Y stage 43 securely mounted on the base frame 41, and the X-Y stage 43 contains an electric heater 43A which is symbolically illustrated in FIG. 4. A wiring board 5 is set in place on the X-Y stage 43, and the X-Y stage 43 is operated so that the wiring board 5 is moved in an X direction and a Y direction perpendicular to each other.

The soldering apparatus 4 further includes a tool head or chip-holder head 44 provided above the X-Y stage 43, a load sensor 45 securely mounted on the chip-holder head 44, and a voice coil motor 46 securely supported by the arm member 42B of the upright structure 42 to vertically suspend both the chip-holder head 44 and the load sensor 45.

The chip-holder head 44 may be constructed as a vacuum sucker to suck and hold a semiconductor chip 6, and contains an electric heater 44A which is symbolically illustrated in FIG. 4. Also, the load sensor 45 may be formed as a strain gauge featuring a resolution ability of, for example, at most 0.02 N.

The voice coil motor 46 includes a cylindrical magnet 46A securely attached to the arm member 46B of the upright structure 42, a solenoid 46B movably provided in the cylindrical magnet 46A, and a driven stem 46C securely joined to the load sensor 45 so that the vertical suspension of both the chip-holder head 44 and the load sensor 45 from the driven stem 46C is established. Thus, by driving the voice coil motor 46, both the chip-holder head 44 and the load sensor 45 can be vertically moved with respect to the wiring board 5 mounted on the X-Y stage 43.

In short, the chip-holder head 44, the load sensor 45 and the voice coil motor 46 form a driver unit for vertically moving the semiconductor chip 6 toward and away from the wiring board 5 placed on the X-Y stage 43.

The soldering apparatus 4 further includes a vertical guide rail 47 supported by the plate-like member 42C of the upright structure 42, and the chip-holder head 44 is slidably engaged with the vertical guide rail 47 so as to be guided during the vertical movement of the chip-holder head 44.

The soldering apparatus 4 also includes a position detector unit 48 for detecting a vertical position of the chip-holder head 44 during the vertical movement of the chip-holder head 44. In particular, the position detector unit 48 includes a linear scale 48A vertically provided along a path for the movement of the chip-holder head 44, and a scale sensor 48B supported by the chip-holder head 44 to detect and read a division of the linear scale 48A. Note, the linear scale 48A may be supported by a suitable column member (not shown) securely attached to the base frame 41.

In addition, the soldering apparatus 4 is provided with a control unit 49 which contains a microcomputer including a central processing unit (CPU), a read-only memory (ROM) for storing various programs and constants, a random-access memory (RAM) for storing temporary data, and an input/output (I/O) interface circuit.

The control unit 49 controls an operation of the X-Y stage 44, and electrically energizes the electric heater 43A contained in the X-Y stage 44. The control unit 49 also controls an operation of the chip-holder head 44, and electrically energizes the electric heater 44A contained in the chip-holder head 44.

Further, the control unit 49 drives the load sensor 45, and processes a load signal output from the load sensor 45. The control unit 49 also drives the solenoid 46B to control an operation of the voice coil motor 46. In addition, the control unit 49 drives the position detector unit 48, and processes a position signal output from the position detector unit 48.

Figure 5A:
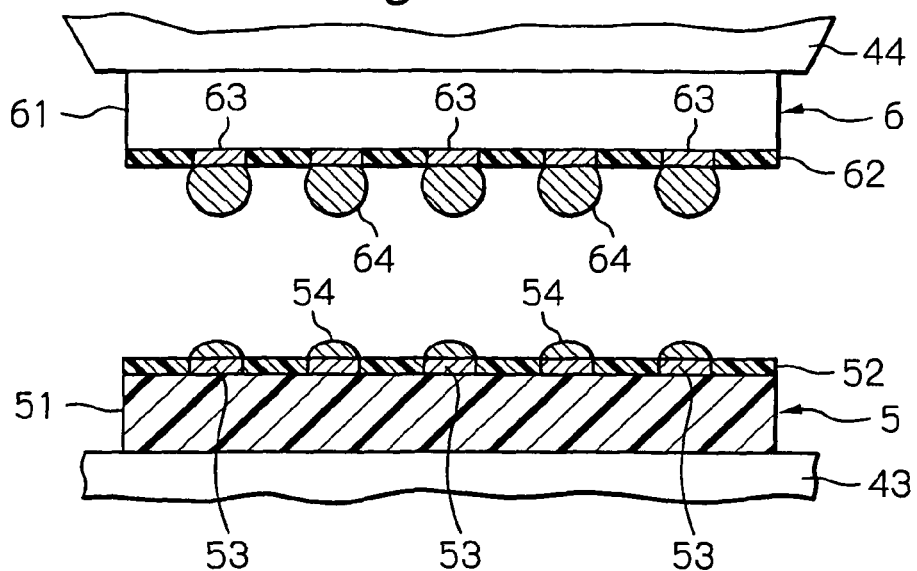
FIGS. 5A to 5C are explanatory views for explaining an operational principle of the soldering apparatus of FIG. 4.
Figure 5B:
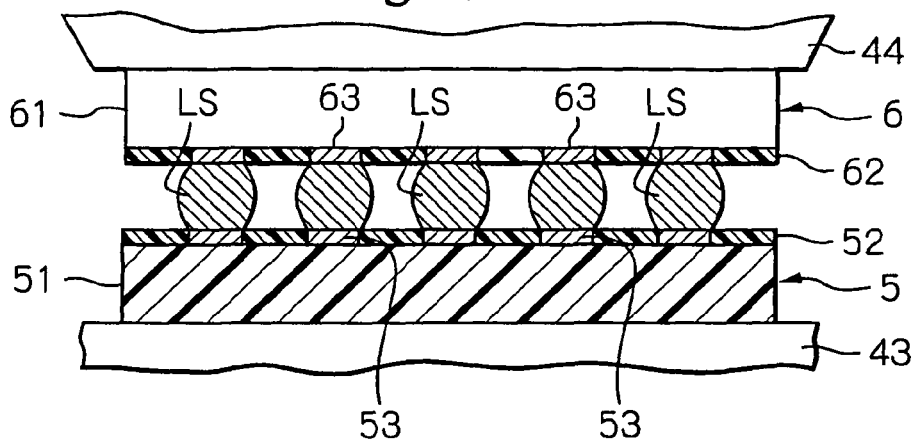
Figure 5C:
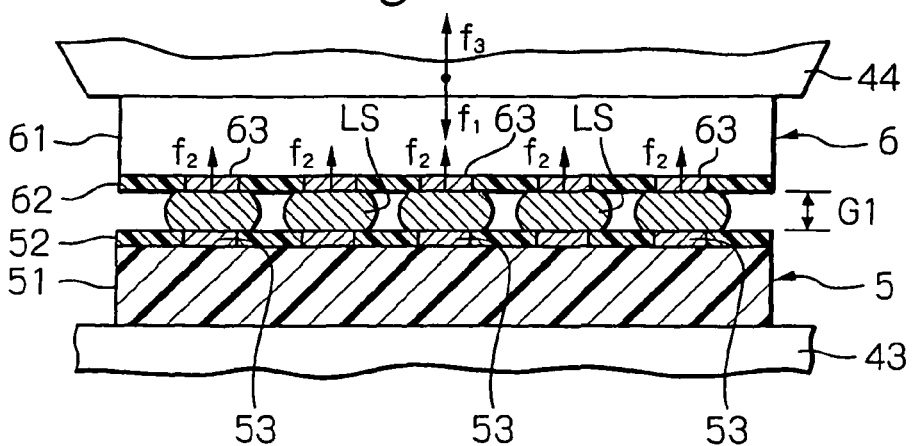

With reference to FIGS. 5A, 5B and 5C, an operational principle of the soldering apparatus 4 according to the present invention is explained below.

First, referring to FIG. 5A which is a partial cross-sectional view, the wiring board 5 is set in place on the X-Y stage 43, and the semiconductor chip 6 is sucked and held by the chip-holder head 44. By operating the X-Y stage 43, the wiring board 5 is positioned so as to be aligned with the semiconductor chip 6.

The wiring board 5 includes an insulating substrate 51 composed of a plurality of insulating layers each having an interconnection pattern structure (not shown), a solder resist layer 52 formed as an uppermost layer on the insulating substrate 51, a plurality of electrode pads 53 formed in the solder resist layer 52, and a plurality of provisional solders 54 formed on the electrode pads 53.

For example, for the solder, a suitable alloy, which is composed of tin (Sn), silver (Ag) and copper (Cu), may be used, and each of the electrode pads 53 is composed of copper (Cu), gold (Au) or the like, exhibiting a wettability by a thermally melted solder. Also, the solder resist layer 52 may be composed of polyimide resin, epoxy resin or the like, which exhibits a non-wettability by a thermally melted solder.

On the other hand, the semiconductor chip 6 is formed as a flip-chip type semiconductor chip, and includes a semiconductor substrate 61, a solder resist layer 62 formed as an uppermost layer on the semiconductor substrate 61, a plurality of electrode pads 63 formed in the solder resist layer 62, and a plurality of metal bumps or solder bumps 64 adhered to the electrode pads 63.

Note, there is a mirror image relationship between an arrangement of the solder bumps 64 and an arrangement of the provisional solders 54.

Each of the solder bumps 64 may be composed of the same alloy as the provisional solders 54 of the wiring board 5, and each of the electrode pads 63 may be composed of copper (Cu), gold (Au) or the like, exhibiting a wettability by a thermally melted solder. Also, the solder resist layer 62 may be composed of polyimide resin, epoxy resin or the like, exhibiting a non-wettability by a thermally melted solder.

In FIG. 5A, the semiconductor chip 6 is downwardly moved toward the wiring board 5 by driving the voice coil motor 46 (see: FIG. 4), and the solder bumps 64 are abutted against the provisional solders 54. Namely, the solder bumps 64 with the provisional solders 54 are properly provided between the wiring board 5 and the semiconductor chip 6.

Then, as shown FIG. 5B, the provisional solders 54 and the solder bumps 64 are thermally melted by electrically energizing the electric heaters 43A and 44A (see: FIG. 4), so that the provisional solders 54 and the solder bumps 64 are respectively fused with each other to thereby produce a plurality of liquid-phase solders LS.

As shown in FIG. 5C, after the production of the liquid-phase solders LS, the semiconductor chip 6 is further downwardly moved toward the wiring board 5 so that the liquid-phase solders LS are pressed by the semiconductor chip 6, but the liquid-phase solders LS cannot be immediately squashed because each of the pressed liquid-phase solders LS produces a reaction force against a pressing force exerted on the liquid-phase solders LS by the semiconductor chip 6.

Thereafter, the movement of the semiconductor chip 6 is controlled by using the load sensor 45, so that the pressing force, which is exerted on the liquid-phase solders LS by the semiconductor chip 6, is maintained at a constant force $f_1$.

When the constant force $f_1$ is exerted on the liquid-phase solders LS, each of the liquid-phase solders LS produces a reaction force $f_2$ against the constant force $f_1$.

In particular, when the liquid-phase solders LS are pressed by the constant force $f_1$, each of the liquid-phase solders LS is deformed so as to be laterally and outwardly swelled as shown in FIG. 5C. At this time, a surface tension acts on each of the pressed liquid-phase solders LS so that the swelled surface area of each of the liquid-phase solders LS is returned to the minimum spherical surface area. Namely, the reaction forces $f_2$ are derived from the respective surface tensions acting on the liquid-phase solders LS.

All the reaction forces $f_2$ exert on the semiconductor chip 6 as a resultant reaction force $f_3$ lifting it upwardly. On the assumption that the liquid-phase solders LS have the same size, while the movement of the semiconductor chip 6 is controlled by using the load sensor 45, i.e., while the resultant force $f_3$ is balanced with the constant force $f_1$, an invariable gap G1 can be always maintained between the wiring board 5 and the semiconductor chip 6.

In short, if a relationship between the constant force $f_1$ and the invariable gap G1 is previously known by either a simulation or a real measurement, it is possible to determine the invariable gap G1 by detecting the constant force $f_1$ by the load sensor 45 (see: FIG. 4), as stated in detail hereinafter.

Incidentally, for example, when the solder bumps 64 have an aimed size or diameter of 100 μm, and when the solder bumps 64 are produced by a printing method, the fluctuation in the size or diameter is ±20 μm as stated above. Also, it is known that the size data or diameter data of the solder bumps 64 represents a Gaussian distribution.

According to the present invention, although the solder bumps 64 fluctuate in the size or diameter thereof, it is possible to always determine the invariable gap G1 between the wring board 5 and the semiconductor chip 6.

Figure 6A:
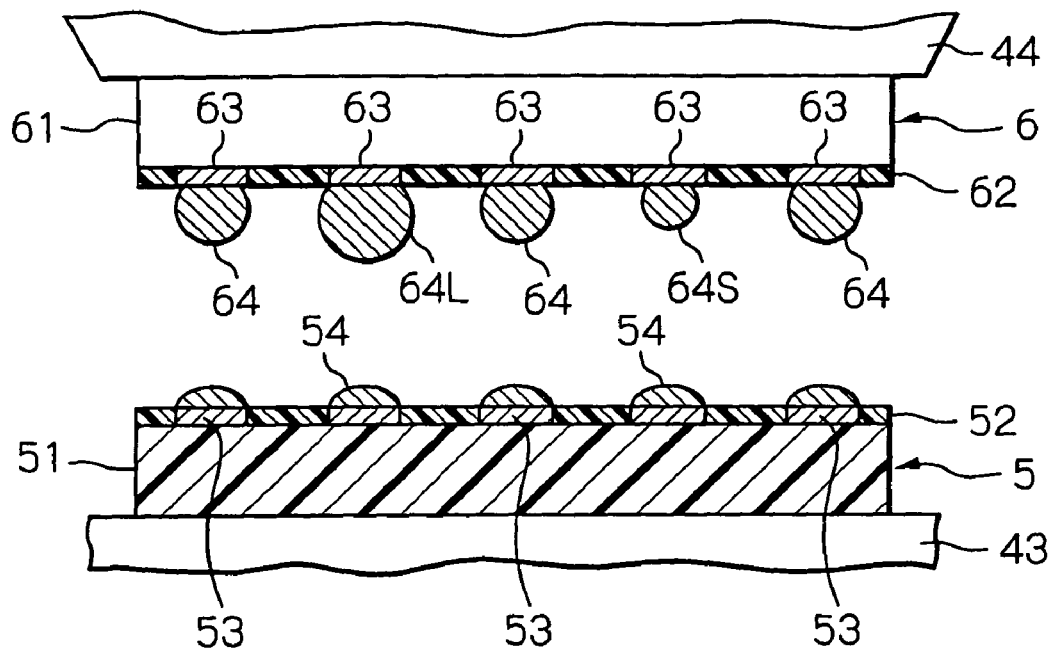
FIGS. 6A and 6B are other explanatory views for explaining the operational principle of the soldering apparatus of FIG. 4.

In particular, referring to FIG. 6A corresponding to FIG. 5A, one of the solder bumps 64 is replaced with a large-sized solder bump 64L having a size or diameter of, for example, 120 μm, and another one of the solder bumps 64 is replaced with a small-sized solder bump 64S having a size or diameter of, for example, 80 μm. Note that it is assumed that the remaining solder bumps 64 have the size or diameter of 100 μm.

Figure 6B:
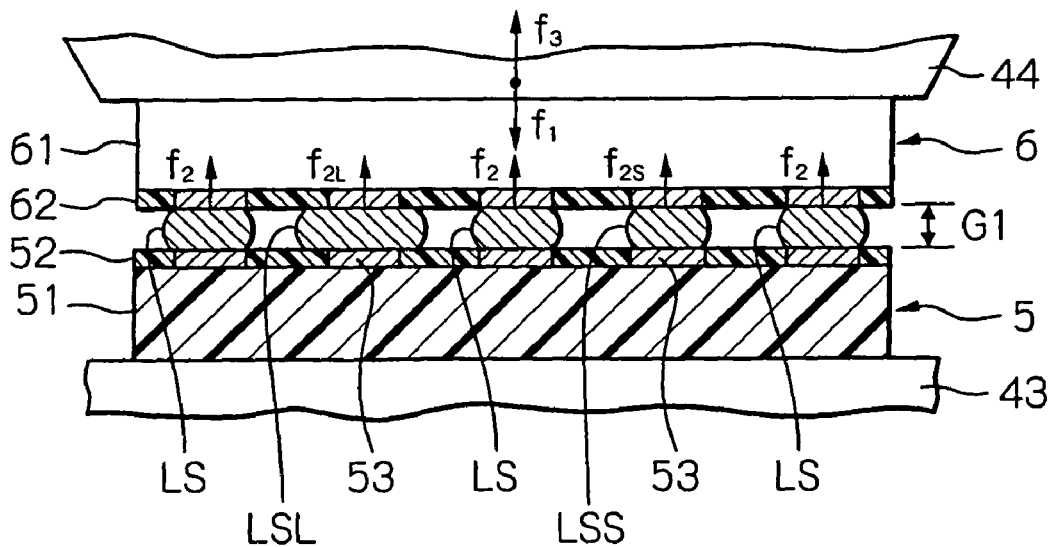

Next, referring to FIG. 6B corresponding to FIG. 5C, the large-sized solder bump 64L and the corresponding provisional solder 54 are thermally fused with each other to thereby produce a large-sized liquid-phase solder LSL, and the small-sized solder bump 64S and the corresponding provisional solder 54 are thermally fused with each other to thereby produce a small-sized liquid-phase solder LSS. Similar to the case of FIG. 5C, the remaining solder bumps 64 are thermally fused with the respective provisional solders 54 to thereby produce the liquid-phase solders LS.

Thus, when the liquid-phase solders LS, LSL and LSS are pressed by the constant force $f_1$, a reaction force $f_{2L}$ obtained from the large-sized liquid-phase solder LSL is larger than the reaction force $f_2$ obtained from each of the liquid-phase solders LS, and a reaction force $f_{2S}$ is smaller than the reaction force $f_2$ obtained from each of the liquid-phase solders LS. Nevertheless, a resultant reaction force $f_3$ obtained from all the reaction forces $f_2$, $f_{2L}$ and $f_{2S}$ is substantially the same one as shown in FIG. 5C, because the difference between the reaction forces $f_2$ and $f_{2L}$ may be compensated for by the difference between the reaction force $f_2$ and $f_{2S}$.

In short, in reality, although the semiconductor chip 6 has the large number of solder bumps (64, 64L, 64S) which fluctuate in the size or diameter thereof, the compensation for the reaction forces ($f_2$, $f_{2L}$, $f_{2S}$) wholly occurs among the liquid-phase solders (LS, LSL, LSS) due to the Gaussian distribution of the size or diameter of the solder bumps (64, 64L, 64S). Thus, although the solder bumps (64, 64L, 64S) fluctuate in the size or diameter thereof, the invariable gap G1 can be always determined between the wiring board 5 and the semiconductor chip 6.

In the foregoing, although the liquid-phase solders LS are pressed by the constant force $f_1$ to thereby determine the invariable gap G1 between the wiring board 5 and the semiconductor chip 6, the liquid-phase solders LS may be stretched by a constant force $f_1'$ to thereby determine another invariable gap between the wiring board 5 and the semiconductor chip 6.

Figure 7:
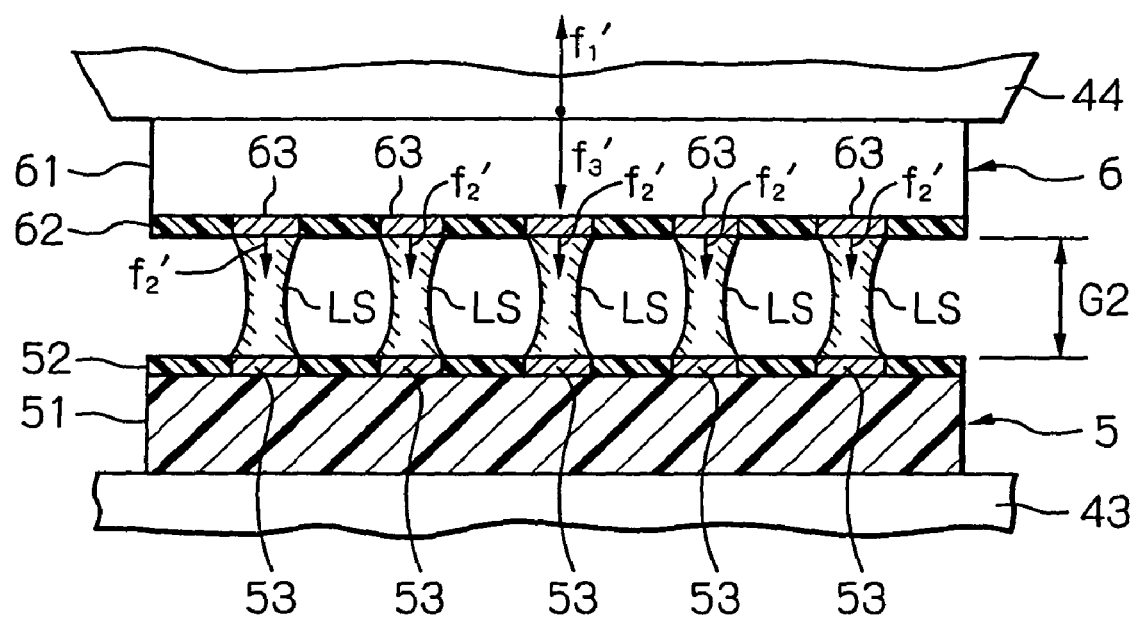
FIG. 7 is another explanatory view for explaining the operational principle of the soldering apparatus of FIG. 4.

In particular, referring to FIG. 7, after the solder bumps 64 are thermally fused with the respective provisional solders 54 to thereby produce the liquid-phase solders LS (see: FIG. 5B), the semiconductor chip 6 is upwardly moved away from the wiring board 5 by driving the voice coil motor 45 (see: FIG. 4), and the movement of the semiconductor chip 6 is feed-back controlled by using the load sensor (see: FIG. 4) so that a constant force $f_1'$ is exerted on the liquid-phase solders LS by the semiconductor chip 6. At this time, the liquid-phase solders LS are stretched by the constant force $f_1'$ so that a reaction force $f_2'$ is produced as a pulling force in each of the stretched liquid-phase solders LS, with the reaction force $f_2'$ being also derived from a surface tension acting on the liquid-phase solder LS concerned. All the reaction forces or pulling forces $f_3'$ exert on the semiconductor chip 6 as a resultant reaction force $f_3'$ pulling it downwardly.

Similar to the above-mentioned case, while the movement of the semiconductor chip 6 is feed-back controlled by using the load sensor (see: FIG. 4), i.e., while the resultant reaction force $f_3'$ is balanced with the constant force $f_1'$, an invariable gap G2 is maintained between the wiring board 5 and the semiconductor chip 6.

In short, if a relationship between the constant force $f_1'$ and the invariable gap G2 is previously known by either a simulation or a real measurement, it is possible to determine the invariable gap G2 by detecting the constant force $f_1'$ by the load sensor 45 (see: FIG. 4), as stated in detail hereinafter.

Figure 8:
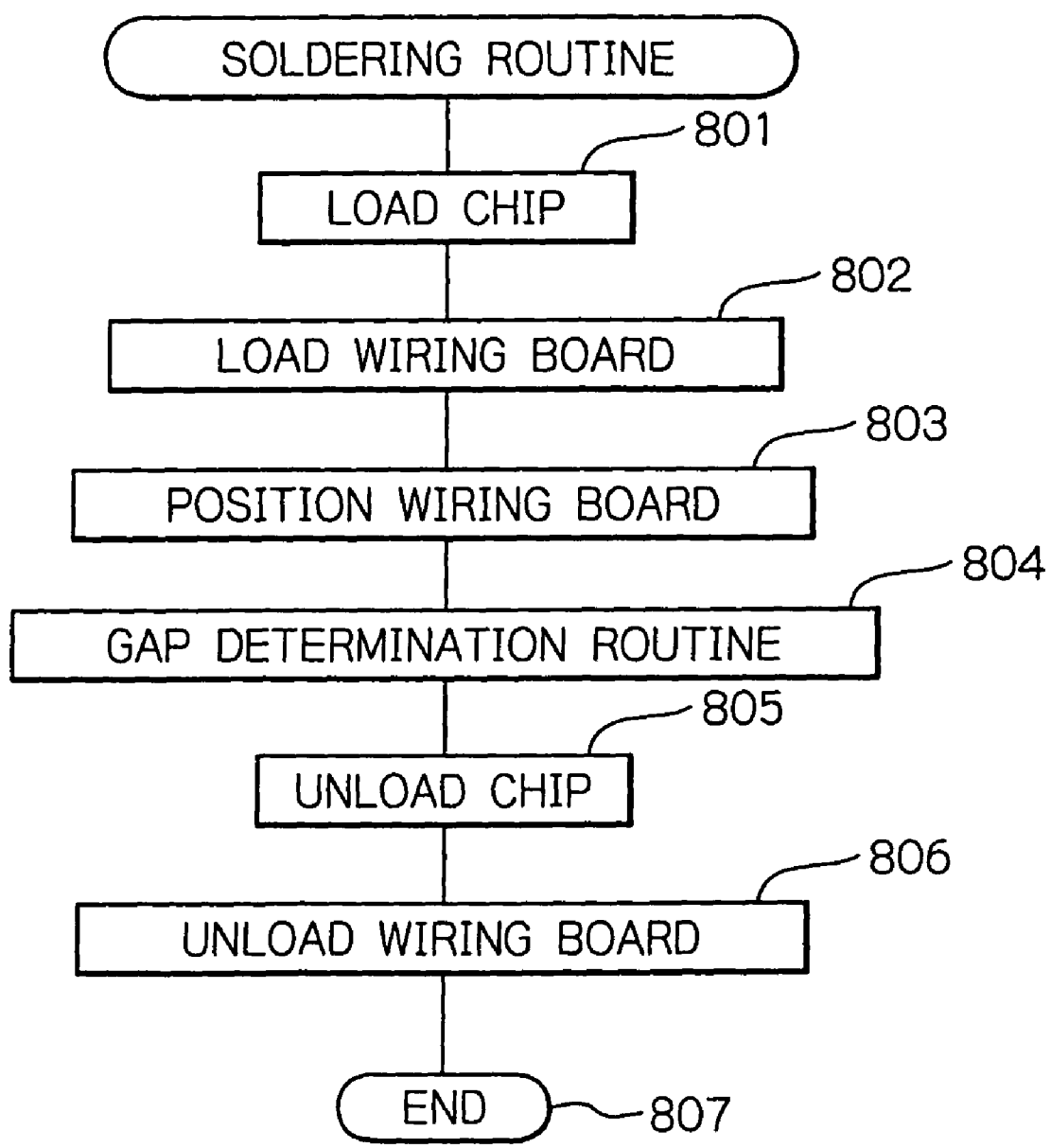
FIG. 8 is a flowchart of a soldering routine executed in the control unit of FIG. 4.

Next, referring to FIG. 8 showing a flowchart of a soldering routine executed by the control unit 49 of FIG. 4, a soldering method executed according to the present invention is explained below.

At step 801, a chip-loading operation is executed. That is, a semiconductor chip 6 is fed from a chip supply station (not shown) to the chip-holder head 44 (see: FIG. 4), and is sucked and held by the chip-holder head 44.

At step 802, a wiring-board loading operation is executed. That is, a wiring board 5 is fed from a wiring-board supply station (not shown) to the X-Y stage 43 (see: FIG. 4), and the wiring board 5 is set in place on the X-Y stage 43.

At step 803, a wiring-board positioning operation is executed so that the wiring board 5 is positioned so as to be aligned with the semiconductor chip 6 by driving the X-Y stage 43, as shown in FIG. 4.

At step 804, a gap determination routine is executed. In the execution of the gap determination routine, the semiconductor chip 6 is soldered to the wiring board 5 so that either of invariable gaps G1 or G2 (see: FIG. 5C or FIG. 7) is determined between the wiring board 5 and the semiconductor chip 6, resulting in a completion of the mounting of the semiconductor chip 6 on the wiring board 5.

Note, the gap determination routine is explained as stated in detail hereinafter.

At step 805, a chip-unloading operation is executed so that the semiconductor chip 6 is unloaded from the chip-holder head 44. Note, after the execution of the chip-unloading operation is completed, the driving of the voice coil motor 46 is stopped so that the chip-holder head 44 is returned to the original position (see: FIG. 4).

At step 806, a wiring-board unloading operation is executed so that the wiring board 5 with the semiconductor chip 6 is unloaded from the X-Y stage 43. Thus, the soldering routine ends at step 807.

FIG. 9 shows a flowchart of a first example of the gap determination routine executed in the step 804 of FIG. 8.

At step 901, flags F1 and F2 are initialized to be "0".

Then, at step 902, the chip-holder head 44 is downwardly moved toward the wiring board 5.

Figure 10A:
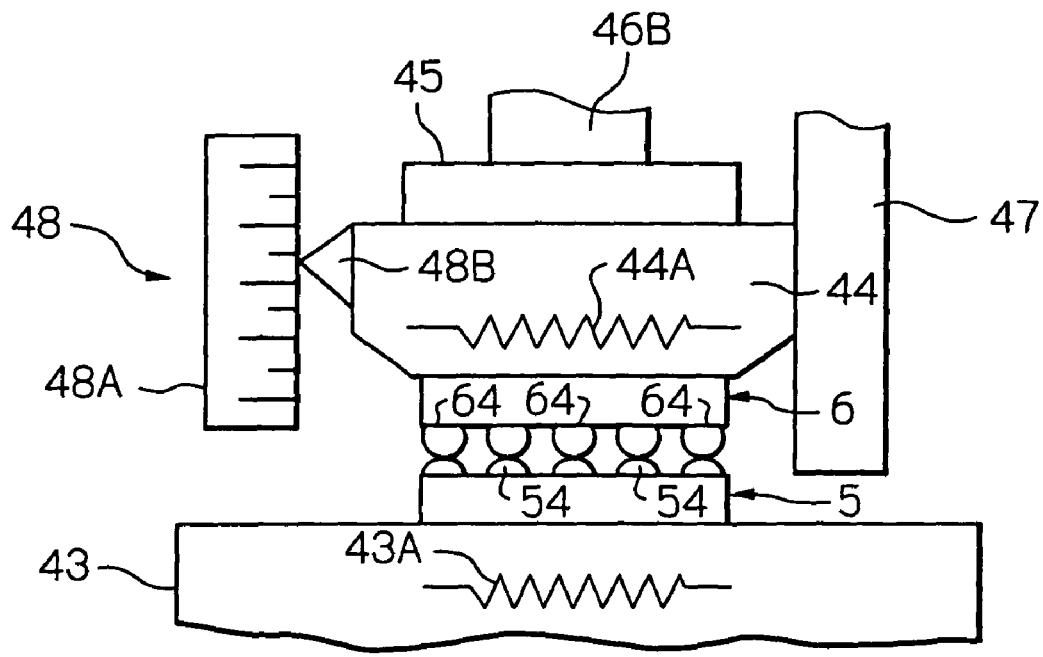
FIGS. 10A to 10D are explanatory views for explaining the first example of the gap determination routine of FIG. 9.

At step 903, it is monitored to determine whether the chip-holder head 44 has reached a position at which the respective solder bumps 64 are abutted against the provisional solders 54, as shown in FIG. 10A. Namely, when the solder bumps 64 are abutted against the provisional solders 54, the solder bumps 64 with the provisional solders 54 are properly provided between the wiring board 5 and the semiconductor chip 6.

For example, the abutting of the solder bumps 64 against the provisional solders 54 may be detected by using the load sensor 45. In particular, after the solder bumps 64 are abutted against the provisional solders 54, the load sensor 45 senses a predetermined large load because the driving of the voice coil motor 46 is continued even though the downward movement of the chip-holder head 44 is stopped due to the abutting of the solder bumps 64 against the provisional solders 54. Thus, it is possible to detect the abutting of the solder bumps 64 against the provisional solders 54 by determining whether the predetermined large load (e.g., more than 1 kg) is sensed by the load sensor 46.

Optionally, the abutting of the solder bumps 64 against the provisional solders 54 may be detected by counting a sufficient time in which the solder bumps 64 can be abutted against the provisional solders 54 during the downward movement of the semiconductor chip 6.

Figure 10B:
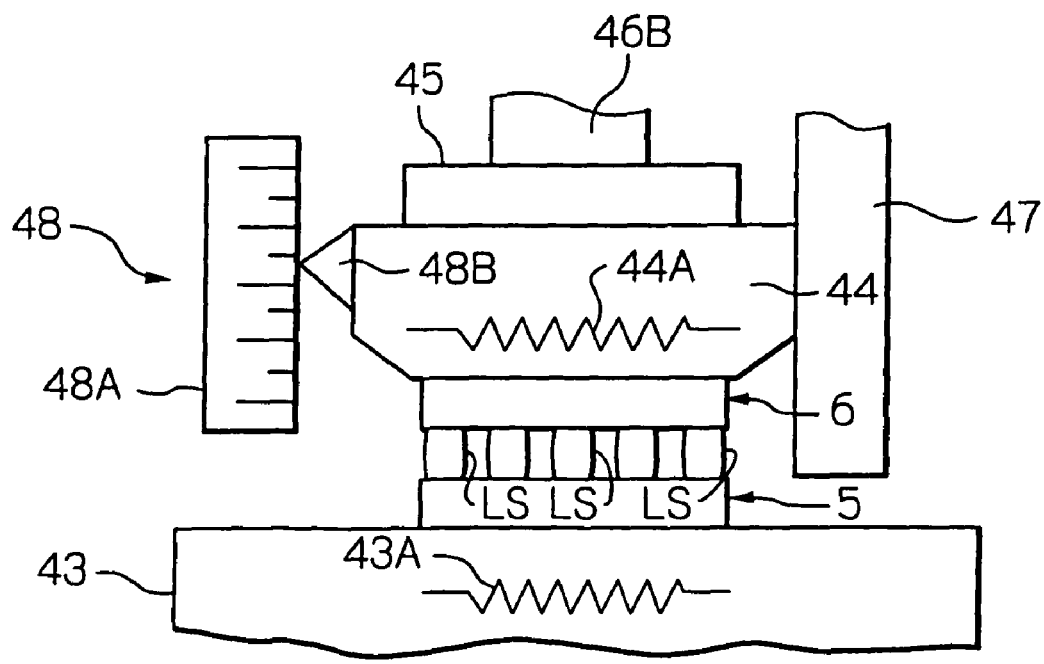
Figure 10C:
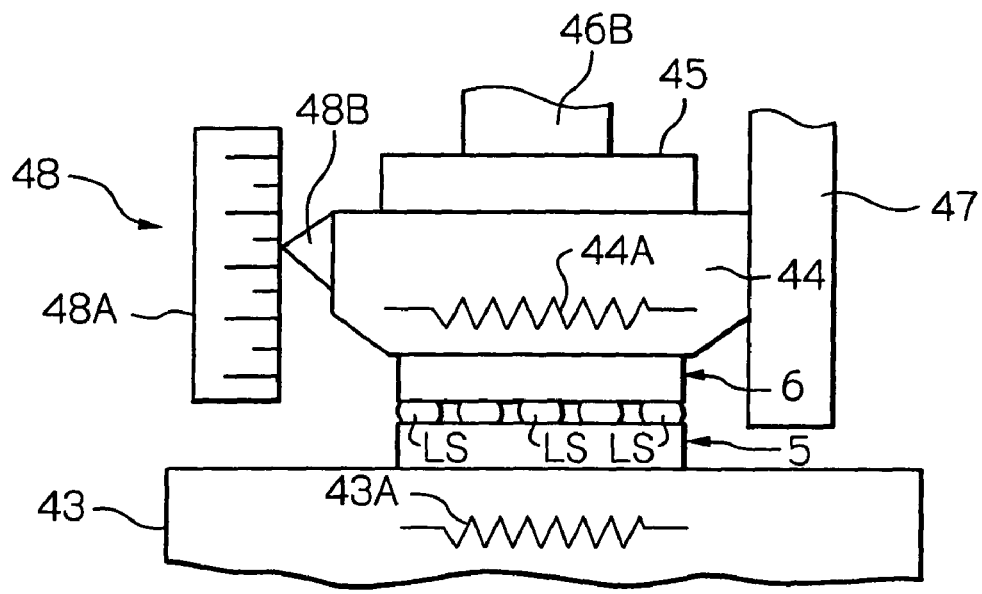
Figure 10D:
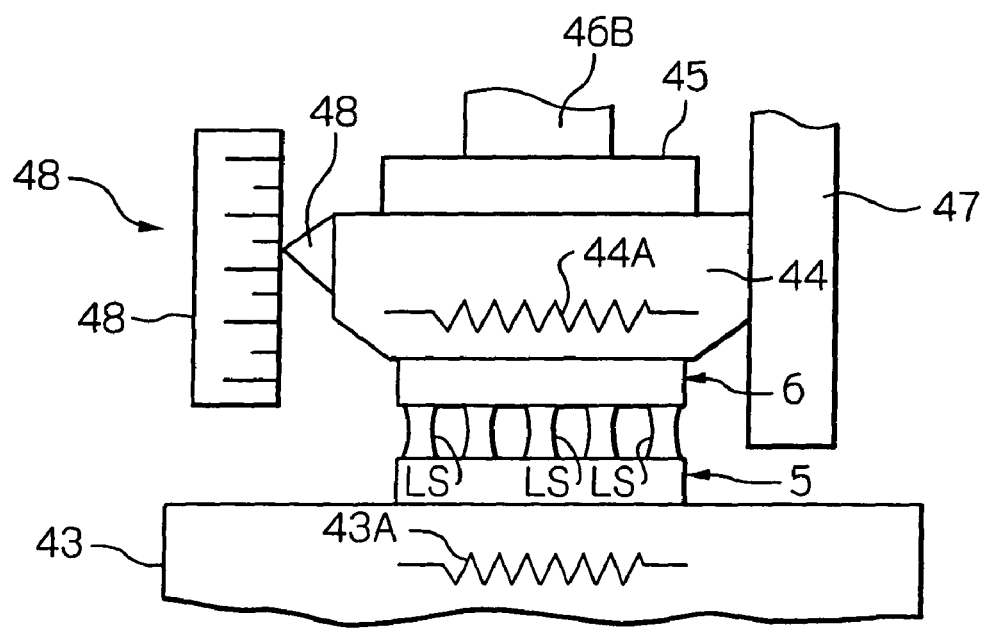

After the abutting of the solder bumps 64 against the provisional solders 54 is confirmed, the control proceeds to step 904, in which the electric heaters 43A and 44A are electrically energized so that the provisional solders 54 and the solder bumps 64 are thermally melted, so that the solder bumps 64 are respectively fused with the provisional solders to thereby produce the liquid-phase solders LS (see: FIG. 5A and FIG. 10B).

At step 905, a pressing load data L is fetched from the load sensor 45, and the control proceeds to step 906, in which it is determined whether the pressing load data L is larger than a predetermined constant pressing force $f_1$ (see: FIG. 5C). If $L \geq f_1$, the control proceeds to step 907, in which the chip-holder head 44 is moved upwardly. On the other hand, if $L < f_1$, the control proceeds from step 906 to step 908, in which the chip-holder head 44 is moved downwardly.

In either event, the control proceeds to step 909, in which it is determined whether the flag F1 is set to be "0" or "1". At the initial stage, since F1="0", the control proceeds to step 910, in which it is determined whether a time $T_1$ has elapsed. When the time $T_1$ has not elapsed, the control returns to step 905.

Namely, the routine comprising steps 906, 907, 908, 909 and 910 is repeatedly executed until the time $T_1$ has elapsed at step 910. The time $T_1$ is previously defined as a sufficient time in which a temperature of the liquid-phase solders LS can rise to a soldering temperature (e.g. 300° C.) necessary to obtain a sufficient soldering of the semiconductor chip 6 to the wiring board 5, and in which the chip-holder head 44 can stay at a position at which the constant pressing force $f_1$ is stably exerted on the liquid-phase solders LS. For example, the time $T_1$ may be a time falling within a range from 3 to 5 sec.

In short, by repeatedly executing the routine comprising steps 906, 907, 908, 909 and 910, the movement of the chip-holder head 44 is feed-back controlled so that an invariable gap G1 (see: FIG. 5C) is determined between the wiring board 5 and the semiconductor chip 6.

At step 910, when it is confirmed that the time $T_1$ has elapsed, the control proceeds to step 911, in which the flag F1 is set to be "1".

Then, at step 912, it is determined whether the flag F2 is set to be "0" or "1".

At the initial stage, since F2="0", the control proceeds to step 913, in which the electric heaters 43A and 44A are deenergized. Then, at step 914, a cooling process is started. In the cooling process, cool air is blown over the liquid-phase solders LS, using a well known cooling system (not shown) included in the soldering apparatus 4 (see: FIG. 4).

At step 915, the flag F2 is set to be "1".

Then, at step 916, it is determined whether a time $T_2$ has elapsed. When the time $T_2$ has not elapsed, the control returns to step 905.

Namely, the routine comprising steps 906, 907, 908, 909, 912 and 916 is repeatedly executed until the time $T_2$ has elapsed at step 916. Note, at this stage, F1="1" and F2="1". The time $T_2$ is previously defined as a sufficient time in which the liquid-phase solders LS can be cooled so as to be set. For example, the time $T_2$ may be at least 10 sec.

In short, during the cooling process, the movement of the chip-holder head 44 is feed-back controlled so that the invariable gap G1 (see: FIG. 5C) is ensured between the wiring board 5 and the semiconductor chip 6. Accordingly, it is possible to absorb dimensional variations of the X-Y stage 43, the chip-holder head 44 and so on, which are caused by thermal expansion and thermal shrinkage thereof, and thus the determination of the invariable gap G1 can be carried out without being subjected to influence from the dimensional variations.

At step 916, when it is confirmed that the time $T_2$ has elapsed, the control proceeds to step 917, in which the cooling process is stopped. Then, the control returns to step 805 of FIG. 8 by step 918.

FIG. 11 shows a flowchart of a second example of the gap determination routine executed in the step 804 of FIG. 8.

At step 1101, flags F1 and F2 are initialized to be "0". Then, at step 1102, the chip-holder head 44 is downwardly moved toward the wiring board 5.

At step 1103, it is monitored to determine whether the chip-holder head 44 has reached a position at which the respective solder bumps 64 are abutted against the provisional solders 54 (see: FIG. 10A). Namely, when the solder bumps 64 are abutted against the provisional solders 54, the solder bumps 64 with the provisional solders 54 are properly provided between the wiring board 5 and the semiconductor chip 6.

Note that the abutting of the solder bumps 64 against the provisional solders 54 may be detected in substantially the same manner as in the case of FIG. 9.

After the abutting of the solder bumps 64 against the provisional solders 54 is confirmed, the control proceeds to step 1104, in which the electric heaters 43A and 44A are electrically energized so that the provisional solders 54 and the solder bumps 64 are thermally melted, so that the solder bumps 64 are respectively fused with the provisional solders to thereby produce the liquid-phase solders LS (see: FIG. 5A and FIG. 10B).

At step 1105, the chip-holder head 44 is upwardly moved. Then, at step 1106, a pulling load data L' is fetched from the load sensor 45, and the control proceeds to step 1107, in which it is determined whether the pulling load data L' is smaller than a predetermined constant pulling force $f_1'$ (see: FIG. 7). If L'≦$f_1'$, the control proceeds to step 1108, in which the chip-holder head 44 is moved downwardly. On the other hand, if L'>$f_1'$, the control proceeds from step 1107 to step 1109, in which the chip-holder head 44 is moved upwardly.

Note, when the chip-holder head 44 is upwardly moved as soon as the electric heaters 43A and 44A are electrically energized, the solder bumps 64 of the semiconductor chip 6 may be separated from the provisional solders 54 of the wiring board 5, but the solder bumps 64 can be again abutted against the provisional solders 54 because the pulling load data L' is detected as zero from the load sensor 45 during the separation of the semiconductor chip 6 from the provisional solders 54.

In either event, the control proceeds to step 1110, in which it is determined whether the flag F1 is set to be "0" or "1". At the initial stage, since F1=0, the control proceeds to step 1111, in which it is determined whether a time $T_1$ has elapsed. When the time $T_1$ has not elapsed, the control returns to step 1106.

Namely, the routine comprising steps 1106, 1107, 1108, 1109, 1110 and 1111 is repeatedly executed until the time $T_1$ has elapsed at step 1111. The time $T_1$ is previously defined as a sufficient time in which a temperature of the liquid-phase solders LS can rise to a soldering temperature (e.g. 300° C.) necessary to obtain a sufficient soldering of the semiconductor chip 6 to the wiring board 5, and in which the chip-holder head 44 can stay at a position at which the constant pulling force $f_1'$ is stably exerted on the liquid-phase solders LS. For example, the time $T_1$ may be a time falling within a range from 3 to 5 sec.

In short, by repeatedly executing the routine comprising steps 1106, 1107, 1108, 1109, 1110 and 1111, the movement of the chip-holder head 44 is feed-back controlled so that an invariable gap G2 (see: FIG. 7) is determined between the wiring board 5 and the semiconductor chip 6.

At step 1111, when it is confirmed that the time $T_1$ has elapsed, the control proceeds to step 1112, in which the flag F1 is set to be "1". Then, at step 1113, it is determined whether the flag F2 is set to be "0" or "1".

At the initial stage, since F2="0", the control proceeds to step 1114, in which the electric heaters 43A and 44A are deenergized. Then, at step 1115, a cooling process is started. In the cooling process, a cool air is blown over the liquid-phase solders LS, using the well known cooling system.

At step 1116, the flag F2 is set to be "1". Then, at step 1117, it is determined whether a time $T_2$ has elapsed. When the time $T_2$ has not elapsed, the control returns to step 1106.

Namely, the routine comprising steps 1106, 1107, 1108, 1109, 1110, 1113 and 1117 is repeatedly executed until the time $T_2$ has elapsed at step 1117. Note, at this stage, F1="1" and F2="1". The time $T_2$ is previously defined as a sufficient time in which the liquid-phase solders LS can be cooled so as to be set. For example, the time $T_2$ may be at least 10 sec.

In short, during the cooling process, the movement of the chip-holder head 44 is feed-back controlled so that the invariable gap G2 (see: FIG. 7) is ensured between the wiring board 5 and the semiconductor chip 6. Accordingly, it is possible to absorb dimensional variations of the X-Y stage 43, the chip-holder head 44 and so on, which are caused by thermal expansion and thermal shrinkage thereof, and thus the determination of the invariable gap G2 can be carried out without being subjected to influence from the dimensional variations.

At step 1117, when it is confirmed that the time $T_2$ has elapsed, the control proceeds to step 1118, in which the cooling process is stopped. Then, the control returns to step 805 of FIG. 8 by step 1119.

Figure 12:
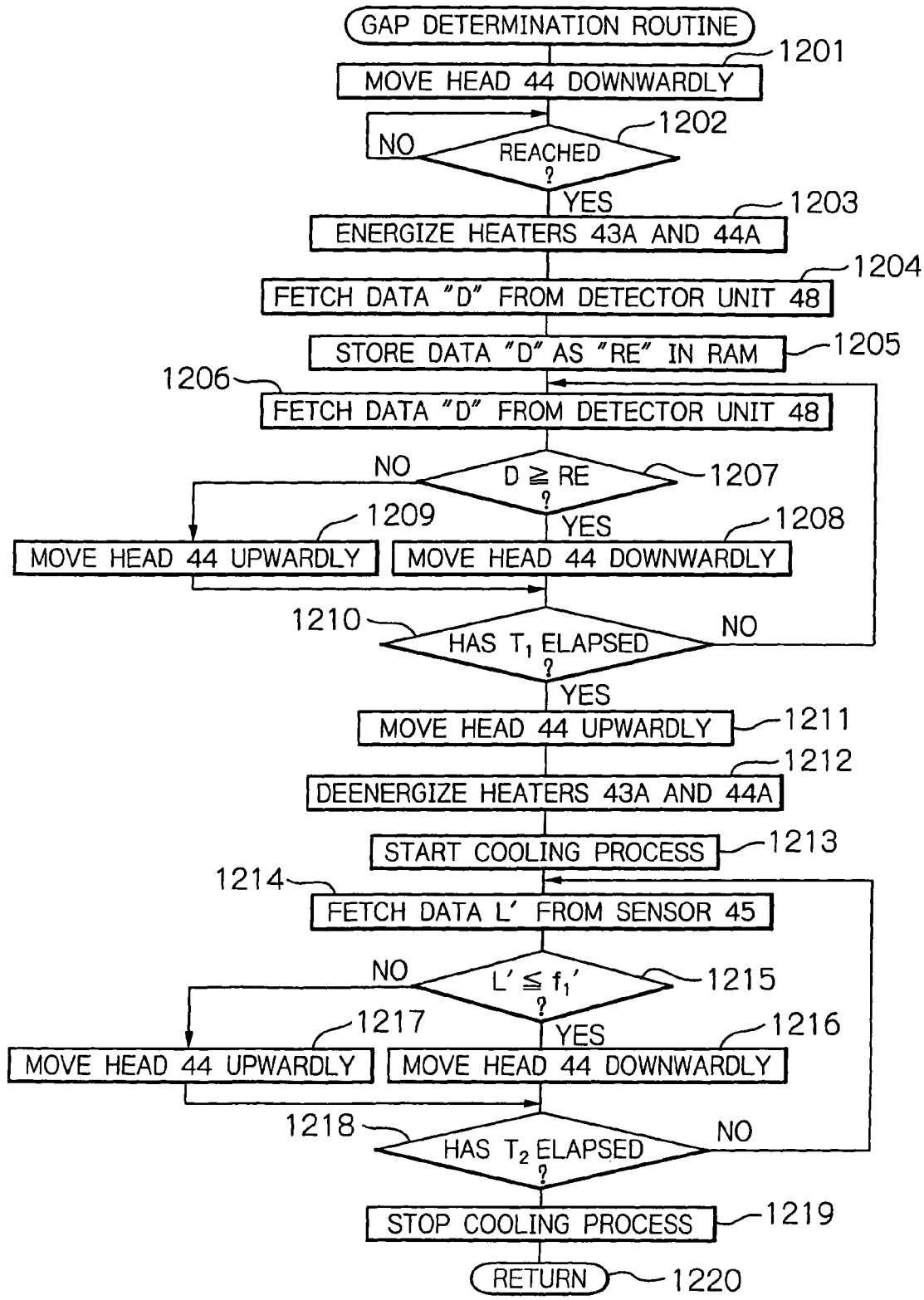
FIG. 12 is a flowchart of a third example of the gap determination routine executed in step 804 of FIG. 8.

FIG. 12 shows a flowchart of a third example of the gap determination routine executed in the step 804 of FIG. 8.

At step 1201, the chip-holder head 44 is downwardly moved toward the wiring board 5. Then, at step 1202, it is monitored to determine whether the chip-holder head 44 has reached a position at which the respective solder bumps 64 are abutted against the provisional solders 54 (see: FIG. 10A). Namely, when the solder bumps 64 are abutted against the provisional solders 54, the solder bumps 64 with the provisional solders 54 are properly provided between the wiring board 5 and the semiconductor chip 6.

Note that the abutting of the solder bumps 64 against the provisional solders 54 may be detected in substantially the same manner as in the case of FIG. 9.

After the abutting of the solder bumps 64 against the provisional solders 54 is confirmed, the control proceeds to step 1203, in which the electric heaters 43A and 44A are electrically energized so that the provisional solders 54 and the solder bumps 64 are thermally melted, so that the solder bumps 64 are respectively fused with the provisional solders to thereby produce the liquid-phase solders LS (see: FIG. 5A and FIG. 10B).

At step 1204, division data D on the linear scale 48A is fetched from the position detector unit 48. Then, at step 1205, the division data D is stored as reference position data RE in the RAM of the control unit 49.

At step 1206, division data on the linear scale 48A is again fetched from the position detector unit 48. Then, at step 1207, it is determined whether the division data D concerned is larger than the reference position data RE.

If D≧RE, the control proceeds to step 1208, in which the chip-holder head 44 is moved downwardly. On the other hand, if D<RE, the control proceeds from step 1207 to step 1209, in which the chip-holder head 44 is moved upwardly.

In either event, the control proceeds to step 1210, it is determined whether a time $T_1$ has elapsed. When the time $T_1$ has not elapsed, the control returns to step 1206.

Namely, the routine comprising steps 1206, 1207, 1208, 1209 and 1210 is repeatedly executed until the time $T_1$ has elapsed at step 1210. The time $T_1$ is previously defined as a sufficient time in which a temperature of the liquid-phase solders LS can rise to a soldering temperature (e.g. 300° C.) necessary to obtain a sufficient soldering of the semiconductor chip 6 to the wiring board 5. In short, the semiconductor head 6 stays at the position, at which the solder bumps 64 are abutted against provisional solders 54, until the temperature of the liquid-phase solders LS can rise to the soldering temperature (e.g. 300° C.).

At step 1210, when it is confirmed that the time $T_1$ has elapsed, the control proceeds step 1211, in which the chip-holder head 44 is upwardly moved. Then, at step 1212, the electric heaters 43A and 44A are deenergized, and, at step 1213, a cooling process is started. In the cooling process, cool air is blown over the liquid-phase solders LS, using the well known cooling system.

At step 1214, a pulling load data L' is fetched from the load sensor 45, and the control proceeds to step 1215, in which it is determined whether the pulling load data L' is smaller than a predetermined constant pulling force $f_1'$ (see: FIG. 7). If L'≦$f_1'$, the control proceeds to step 1216, in which the chip-holder head 44 is moved downwardly. On the other hand, if L'>$f_1'$, the control proceeds from step 1215 to step 1217, in which the chip-holder head 44 is moved upwardly.

In either event, the control proceeds to step 1218, in which it is determined whether a time $T_2$ has elapsed. When the time $T_2$ has not elapsed, the control returns to step 1214.

Namely, the routine comprising steps 1214, 1215, 1216, 1217 and 1218 is repeatedly executed until the time $T_2$ has elapsed at step 1218. The time $T_2$ is previously defined as a sufficient time in which the liquid-phase solders LS can be cooled so as to be set. For example, the time $T_2$ may be at least 10 sec. Then, the control returns to step 805 by step 1220.

In short, during the cooling process, the movement of the chip-holder head 44 is feed-back controlled so that the invariable gap G2 (see: FIG. 7) is ensured between the wiring board 5 and the semiconductor chip 6. Accordingly, similar to the case of FIG. 11, it is possible to absorb dimensional variations of the X-Y stage 43, the chip-holder head 44 and so on, which are caused by thermal expansion and thermal shrinkage thereof, and thus the determination of the invariable gap G2 can be carried out without being subjected to influence from the dimensional variations.

In the above-mentioned embodiments, although the electrode pads 53 of the wiring board 5 are coated with the respective provisional solders 54, it is possible to eliminate the provisional solders 54 from the electrode pads 53, if necessary.

Also, in the above-mentioned embodiments, although the flip-chip type semiconductor chip 6 featuring the solder bumps 64 is soldered to and mounted on the wiring board or interposer 5, the present invention may be applied to a case where a semiconductor package, such as a ball grid array (BGA) package or the like, featuring a plurality of outer electrode terminals or solder balls, is soldered to and mounted on a printed wiring board.

Further, although the provisional solders 54 and the solder bumps 64 are thermally melted by the electric heaters 43A and 44A, it is possible to carry out the thermal melting thereof by using hot air.

Finally, it will be understood by those skilled in the art that the foregoing description is of preferred embodiments of the devices and methods, and that various changes and modifications may be made to the present invention without departing from the spirit and scope thereof.

What is claimed is:

1. A soldering method for mounting a semiconductor device on a wiring board with a plurality of solders provided between said semiconductor device and said wiring board, said soldering method comprising:
   determining a value of a constant force applied between said semiconductor device and said wiring board during a melting of the plurality of solders corresponding to a predetermined value of a gap between said semiconductor device and said wiring board on a basis of a relationship between said constant force and said gap;
   thermally melting the plurality of solders; and
   exerting said constant force of said value during the melting of the plurality of solders by relatively moving said semiconductor device with respect to said wiring board until a resultant reaction force against said constant force produced by all of said plurality of solders is balanced with said constant force,
   wherein said semiconductor device is relatively moved toward said wiring board so that said solders are pressed therebetween, and
   wherein the relative movement of said semiconductor device toward said wiring board is carried out during a rise in temperature of said solders.

2. The soldering method as set forth in claim 1, further comprising:
   detecting a pressing force exerted on said solders during the relative movement of said semiconductor device with respect to said wiring board; and
   controlling the relative movement of said semiconductor device so that said pressing force is obtained as said constant force, resulting in a determination of the gap between said semiconductor device and said wiring board.

3. The soldering method as set forth in claim 1, wherein said semiconductor device is moved away from said wiring board so that said solders are stretched therebetween.

4. The soldering method as set forth in claim 3, further comprising:
   detecting a pulling force exerted on said solders during the relative movement of said semiconductor device with respect to said wiring board,
   wherein a feedback controlling of the relative movement of said semiconductor device is performed such that said pulling force is obtained as said constant force, resulting in a determination of the gap between said semiconductor device and said wiring board.

5. The soldering method as set forth in claim 3, wherein the relative movement of said semiconductor device away from said wiring board is carried out during a fall in a temperature of said solders.

6. The soldering method as set forth in claim 1, wherein said semiconductor device is held by a driver unit having a load sensor, and is moved with respect to said wiring board by driving said driver unit having said load sensor, and wherein a force exerted as said resultant reaction force on said driver unit by said solders is detected by said load sensor so that said force is obtained as said constant force, resulting in a determination of the gap between said semiconductor device and said wiring board.

7. The soldering method as set forth in claim 6, wherein said force is detected as a pressing force exerted on said solders.

8. The soldering method as set forth in claim 6, wherein said force is detected as a pulling force exerted on said solders.

9. The soldering method as set forth in claim 1, wherein said exerting constant force comprises exerting said constant force on said solders by a single-piece semiconductor device holder head, squeezed between, and in direct contact with a lower surface of a load sensor and said semiconductor device.

10. The soldering method as set forth in claim 9, wherein said single-piece semiconductor device holder head comprises a single-piece body rather than a plurality of pieces.

11. The soldering method as set forth in claim 1, wherein, when a pressing load data is fetched from a load sensor, if the pressing load data is larger than a predetermined constant pressing force, then the semiconductor device holder head is moved upwardly, and if the pressing load data is less than the predetermined constant pressing force, then the semiconductor device holder head is moved downwardly.

12. The soldering method as set forth in claim 11, wherein, when a pulling load data is fetched from the load sensor, if the pulling load data is larger than a predetermined constant pulling force, then the semiconductor device holder head is moved upwardly, and if the pulling load data is less than the predetermined constant pulling force, then the semiconductor device holder head is moved downwardly.

13. A soldering method for mounting a semiconductor device on a wiring board, said soldering method comprising:

determining a value of a constant force applied between said semiconductor device and said wiring board during a melting of a plurality of solders corresponding to a predetermined value of a gap between said semiconductor device and said wiring board on a basis of a relationship between said constant force and said gap;

holding said semiconductor device having a plurality of external metal terminals by a driver unit;

placing said semiconductor device on a wiring board by said driver unit so that said external metal terminals are provided therebetween;

thermally heating said external metal terminals to thereby produce melted metal terminals;

moving said semiconductor device with respect to said wiring board by said driver unit;

detecting a force exerted as a reaction force on said driver unit by said melted metal terminals between said semiconductor device and said wiring board during a relative movement of said semiconductor device with respect to said wiring board; and controlling said driver unit so that said constant force of said value is applied between said semiconductor device and said wiring board during the melting of said metal terminals, wherein said semiconductor device is relatively moved toward said wiring board so that said solders are pressed therebetween, and wherein the relative movement of said semiconductor device toward said wiring board is carried out during a rise in temperature of said solders.

14. The soldering method as set forth in claim 13, further comprising:

exerting a constant force on said melted metal terminals by a single-piece semiconductor device holder head, squeezed between, and in direct contact with a lower surface of a load sensor and said semiconductor device.

15. The soldering method as set forth in claim 14, wherein said single-piece semiconductor device holder head comprises a single-piece body rather than a plurality of pieces.

16. The soldering method as set forth in claim 14, wherein, when a pressing load data is fetched from a load sensor, if the pressing load data is larger than a predetermined constant pressing force, then the semiconductor device holder head is moved upwardly, and if the pressing load data is less than the predetermined constant pressing force, then the semiconductor device holder head is moved downwardly.

17. The soldering method as set forth in claim 16, wherein, when a pulling load data is fetched from the load sensor, if the pulling load data is larger than a predetermined constant pulling force, then the semiconductor device holder head is moved upwardly, and if the pulling load data is less than the predetermined constant pulling force, then the semiconductor device holder head is moved downwardly.

18. A soldering method for mounting a semiconductor device on a wiring board, said soldering method comprising:

determining a value of a constant force applied between said semiconductor device and said wiring board during a melting of a plurality of solders corresponding to a predetermined value of a gap between said semiconductor device and said wiring board on a basis of a relationship between said constant force and said gap;

thermally melting the plurality of solders;

exerting said constant force of said value during the melting of the plurality of solders by relatively moving said semiconductor device with respect to said wiring board until a resultant reaction force against said constant force produced by all of the plurality of solders is balanced with said constant force, said constant force being exerted by a single-piece semiconductor device holder head, squeezed between, and in direct contact with a lower surface of a load sensor and said semiconductor device, and feedback controlling said relatively moving of said semiconductor device comprising fetching a pressing load data and pulling load data from the load sensor, wherein, if the pressing load data is larger than a predetermined constant pressing force, then the semiconductor device holder head is moved upwardly, and if the pressing load data is less than the predetermined constant pressing force, then the semiconductor device holder head is moved downwardly, wherein, if the pulling load data is larger than a predetermined constant pulling force, which is different from the predetermined constant pressing force, then the semiconductor device holder head is moved upwardly, and if the pulling load data is less than the predetermined constant pulling force, then the semiconductor device holder head is moved downwardly, wherein said semiconductor device is relatively moved toward said wiring board so that said solders are pressed therebetween, and wherein the relative movement of said semiconductor device toward said wiring board is carried out during a rise in temperature of said solders.

* * * * *